(12) United States Patent
Hagiwara et al.

(10) Patent No.: US 6,800,527 B2
(45) Date of Patent: Oct. 5, 2004

(54) ONE TIME PROGRAMMABLE SEMICONDUCTOR NONVOLATILE MEMORY DEVICE AND METHOD FOR PRODUCTION OF SAME

(75) Inventors: Yoshiaki Hagiwara, Kanagawa (JP); Hideaki Kuroda, Kanagawa (JP); Michitaka Kubota, Kanagawa (JP); Akira Nakagawara, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/366,564

(22) Filed: Feb. 14, 2003

(65) Prior Publication Data

US 2003/0146467 A1 Aug. 7, 2003

Related U.S. Application Data

(62) Division of application No. 09/888,534, filed on Jun. 26, 2001, now Pat. No. 6,583,490.

(30) Foreign Application Priority Data

Feb. 2, 2001 (JP) ..................................... P2001-027307

(51) Int. Cl.[7] ......................................... H01L 21/8236
(52) U.S. Cl. ...................................................... 438/278
(58) Field of Search ................................ 438/257, 273, 438/278, 276

(56) References Cited

U.S. PATENT DOCUMENTS 5,751,012 A 5/1998 Wolstenholme et al.
6,034,882 A 3/2000 Johnson et al.

FOREIGN PATENT DOCUMENTS

EP 0323078 7/1989
JP 56088357 7/1981

(List continued on next page.)

OTHER PUBLICATIONS

Japanese Examined Patent Publication (Kokoku) No. 4–9388, Feb. 20, 1992, (abstract–Publication No. 57–103348).

(List continued on next page.)

Primary Examiner—W. David Coleman
(74) Attorney, Agent, or Firm—Rader, Fishman & Grauer PLLC; Ronald P. Kananen

(57) ABSTRACT

A semiconductor nonvolatile memory device improving reproducibility and reliability of insulation breakage of a silicon oxide film and capable of reducing the manufacturing cost and a method for production of the same, wherein each of the memory cells arranged in a matrix form has an insulating film breakage type fuse comprising an impurity region of a first conductivity type formed on a semiconductor substrate, a first insulating film formed on the semiconductor substrate while covering the impurity region, an opening formed in the first insulating film so as to reach the impurity region, and a first semiconductor layer of a first conductivity type, a second insulating film, and a second semiconductor layer of a second conductivity type successively stacked in the opening from the impurity region side, or has an insulating film breakage type fuse comprising an impurity region of a first conductivity type in the first semiconductor layer having an SOI structure, a first insulating film on the SOI layer, an opening reaching the impurity region, and a second insulating film and a second semiconductor layer of a second conductivity type stacked in the opening.

10 Claims, 22 Drawing Sheets

FOREIGN PATENT DOCUMENTS

| | | |
|---|---:|---|
| JP | 58-28750 A1 | 2/1983 |
| JP | 62026854 A1 | 2/1987 |
| JP | 1235374 A1 | 9/1989 |
| JP | 03020075 | 1/1991 |
| JP | 403020075 A1 | 1/1991 |
| JP | 356088357 A1 | 7/1991 |
| JP | 4-9388 A1 | 1/1992 |
| JP | 63-2207 | 1/1998 |
| JP | 10341000 A1 | 12/1998 |

OTHER PUBLICATIONS

Japanese Examined Patent Publication (Kokoku) No. 58–28750, Jun. 17, 1983, (abstract–Publication No. 56–091464).

Japanese Examined Patent Publication (Kokoku) No. 63–22073, May 10, 1988, (abstract–Publication No. 56–091446).

A.S. Sedra and K.C. Smith, "Microelectronic Circuits", 1990, published by Saunders College Publishing (Third Edition), p. 958.

European Search Report dated Apr. 8, 2002.

ONE TIME PROGRAMMABLE SEMICONDUCTOR NONVOLATILE MEMORY DEVICE AND METHOD FOR PRODUCTION OF SAME

This application is a divisional application of application Ser. No. 09/888,534; filed: Jun. 26, 2001 U.S. Pat. No. 6,583,490.

BACKGROUND OF THE INVENTION

1. Field of the Invention

The present invention relates to a semiconductor nonvolatile memory device and a method for production of the same, more particularly relates to an OTP (one time programmable) semiconductor nonvolatile memory device capable of being written with data only one time and a method for production of the same.

2. Description of the Related Art

As nonvolatile semiconductor memory devices, floating gate type, MNOS type, MONOS type, and other flash memories having various characteristics and capable of erasing data together have been developed. They have CMOS transistors as decoders and other peripheral transistors of memory cell arrays.

However, a flash memory has had a problem in that about 20 to 30 masks were necessary for producing the same, so the manufacturing cost was high.

On the other hand, as a read only memory device capable of being written with data only one time (OTPROM (read only memory)), a memory cell having one transistor and one oxide film fuse has been developed. This is disclosed in for example Japanese Examined Patent Publication (Kokoku) No. 4-9388, Japanese Examined Patent Publication (Kokoku) No. 58-28750, or Japanese Examined Patent Publication (Kokoku) No. 63-22073.

For example, Japanese Examined Patent Publication (Kokoku) No. 4-9388 discloses a memory cell having a structure shown in FIG. 1.

For example, a gate electrode 104 is formed on a channel forming region 102 of a p-type semiconductor substrate 101 via a gate insulating film 103, and a source region 105 and a drain region 106 containing n-type impurities are formed in the semiconductor substrate 101 on the two sides thereof, whereby a MOS field-effect transistor is formed.

An insulating film 110 of silicon oxide is formed covering the MOS transistor, contact holes reaching the gate electrode 104, source region 105, and the drain region 106 are formed, and a gate interconnection 115, source interconnection 116, and a drain interconnection 117 made of for example aluminum are filled in the contact holes.

Here, a silicon oxide film 114 is formed at an interface between the source region 105 and the drain interconnection 116 and insulates the two.

In a memory cell having the above structure, by applying a high voltage between the source region 105 and the source interconnection 116 according to the data to be written, the insulation in the silicon oxide film 114 is broken and the source region 105 and the source interconnection 116 are made conductive. Thus, data can be stored by conduction or nonconduction between the source region 105 and the source interconnection 116 in each memory cell.

Also, Japanese Examined Patent Publication (Kokoku) No. 58-28750 and Japanese Examined Patent Publication (Kokoku) No. 63-22073 disclose memory cells having structures shown in FIG. 2 and FIG. 3 are disclosed.

These are substantially the same as the memory cell having the structure shown in FIG. 1, but a polysilicon layer 120 is formed connected to the source region 105, and the source interconnection 116 is formed at an upper layer thereof via the silicon oxide film 114.

Also, in FIG. 2, the polysilicon layer 120 is formed also in the drain region 106, and the drain interconnection 117 is formed at an upper layer thereof.

In a memory cell having the above structure as well, by applying a high voltage between the source region 105 and the source interconnection 116 according to the data to be written, the insulation in the silicon oxide film 114 is broken and the source region 105 and the source interconnection 116 are made conductive. Thus, data can be stored by conduction or nonconduction between the source region 105 and the source interconnection 116 in each memory cell.

On the other hand, U.S. Pat. No. 6,034,882 discloses a semiconductor nonvolatile memory device having a memory cell array and having a peripheral circuit shown in an equivalent circuit diagram of FIG. 4A.

Namely, as shown in FIG. 4A memory cells M are provided at intersecting points of conductive layers (C1, C3, C5, C7) receiving layer selection signals LSS by a switching transistor SWT controlled by a row decoder RD and conductive layers (C2, C4, C6) acting as the bit lines BL.

The above memory cell has a structure shown in for example FIG. 4B.

Namely, a $p^+$ type polysilicon layer 202 is formed on a conductive layer 201 forming the conductive layers (C1, C3, C5, C7), and an n-type polysilicon layer 203 is formed at an upper layer thereof to thereby form a diode. A silicon oxide film 204 is formed at an upper layer of the polysilicon layer 203, an $n^+$ type polysilicon layer 205 is formed at an upper layer thereof, and a conductive layer 206 forming the conductive layers (C2, C4, C6) is laid at an upper layer thereof.

Here, the polysilicon layer 203 and the polysilicon layer 205 are insulated by the silicon oxide film 204.

In a memory cell having the above structure, by applying a high voltage between the polysilicon layer 203 and the polysilicon layer 205 according to the data to be written, the insulation in the silicon oxide film 204 is broken and the polysilicon layer 203 and the polysilicon layer 205 are made conductive. Therefore, data can be stored according to existence/nonexistence of the diode element in each memory cell (portion where the polysilicon layer 202 and the polysilicon layer 203 are stacked).

In a memory cell having the structure shown in FIG. 1 to FIG. 3 described above, however, there was a problem in reproducibility and reliability of the breakage of insulation of the silicon oxide film.

Also, the semiconductor nonvolatile memory device shown in FIGS. 4A and 4B is configured by memory cells each comprised of a fuse of an insulating film breakage type and a diode as an active element connected therein repeating in three dimensions. Therefore, it becomes necessary to form a silicon layer having a crystallinity required for comprising the active element in an upper layer of the interconnection made of aluminum, so there is a large influence of heat treatment upon the aluminum interconnections and accompanying major difficulties in actual production.

Further, by stacking a plurality of layers having memory cells, for example, nine layers, it is possible to increase the degree of integration and to thereby realize a reduction of the manufacturing cost per unit storage capacity of the semiconductor nonvolatile memory device, but there was a problem in that, even if N number of layers are stacked, the manufacturing cost per unit storage capacity becomes larger than 1/N due to the influence of the peripheral circuits etc., so an effect of the reduction of cost cannot be sufficiently obtained.

SUMMARY OF THE INVENTION

An object of the present invention is to provide a semiconductor nonvolatile memory device capable of improving the reproducibility and reliability of the breakage of insulation of the silicon oxide film and capable of further reducing the manufacturing cost and a method for production of the same.

To attain the above object, a semiconductor nonvolatile memory device of the present invention has at least one memory cell and is programmable one time, wherein the memory cell comprises an impurity region of a first conductivity type formed in a semiconductor substrate, a first insulating film formed on the semiconductor substrate covering the impurity region, an opening formed in the first insulating film so as to reach the impurity region, and a program portion comprising a first semiconductor layer of the first conductivity type, a second insulating film, and a second semiconductor layer of a second conductivity type, the first semiconductor layer, the second insulating film and the second semiconductor layer being successively stacked in the opening, the first semiconductor layer being formed on the impurity region, the second insulating film being changed in a conductive state in response to a program data to thereby electrically connect between the first and second semiconductor layers.

In the semiconductor nonvolatile memory device of the present invention, preferably insulation breakage in the second insulating film in the program portion is caused by applying a predetermined voltage between the first semiconductor layer and the second semiconductor layer in response to the program data to be stored in the memory cell, and data is stored by the conduction or nonconduction between the first semiconductor layer and the second semiconductor layer in each memory cell.

In the semiconductor nonvolatile memory device of the present invention, preferably, in the memory cell, a gate electrode acting as a word line is formed on the semiconductor substrate via a gate insulating film, a channel forming region is provided on the semiconductor substrate below the gate electrode, a field-effect transistor using the impurity region as the drain region is formed, and the bit line is connected to the second semiconductor layer.

More preferably, the source region of the field-effect transistor is grounded.

Alternatively, more preferably, provision is further made of a means for detecting a current flowing from the source region of the field-effect transistor to the semiconductor substrate side.

Alternatively, more preferably, the word line and the bit line are connected to a row decoder and a column decoder including pass transistors for passing supplied signals therethrough, and more preferably, inverted signals of address signals are supplied to the row decoder and the column decoder from an external device together with forward signals.

In the semiconductor nonvolatile memory device of the present invention, preferably the plurality of memory cells are arranged in a matrix form.

In the semiconductor nonvolatile memory device of the present invention, the memory cell has an impurity region of a first conductivity type formed on the semiconductor substrate, a first insulating film formed on the semiconductor substrate while covering the impurity region, an opening formed in the first insulating film so as to reach the impurity region, and a first semiconductor layer of a first conductivity type, a second insulating film, and a second semiconductor layer of a second conductivity type successively stacked in the opening from the impurity region side.

By applying a predetermined voltage between the first semiconductor layer and the second semiconductor layer, the reproducibility and reliability are improved, and insulation breakage in the second insulating film can be caused.

Also, since a memory cell can be comprised by a simple structure, by making for example the row decoder and the column decoder by only pass transistors, the device can be produced while reducing the number of masks to about six, so the manufacturing cost can be suppressed.

Also, to attain the above object, a semiconductor nonvolatile memory device of the present invention has at least one memory cell and is programmable one time, wherein the memory cell comprises a first interconnection, a first insulating film formed on the first interconnection, an opening formed in the first insulating film so as to reach the first interconnection, a program portion comprising a first semiconductor layer of a first conductivity type, a second insulating film, and a second semiconductor layer of a second conductivity type, the first semiconductor layer, the second insulating film and the second semiconductor layer being successively stacked in the opening, the first semiconductor layer being formed on the first interconnection, the second insulating film being changed in a conductive state in response to a program data to thereby electrically connect between the first and second semiconductor layers, and a second interconnection formed connected to the second semiconductor layer.

In the semiconductor nonvolatile memory device of the present invention, preferably insulation breakage in the second insulating film in the program portion is caused by applying a predetermined voltage between the first semiconductor layer and the second semiconductor layer in response to the program data to be stored in the memory cell, and data is stored by the conduction or nonconduction between the first semiconductor layer and the second semiconductor layer in each memory cell.

In the semiconductor nonvolatile memory device of the present invention, preferably, in the memory cell, the first interconnection is a word line and the second interconnection is a bit line.

More preferably, the word line and the bit line are connected to a row decoder and a column decoder including pass transistors for passing supplied signals therethrough.

Also, more preferably, inverted signals of address signals are supplied to the row decoder and the column decoder from an external device together with the forward signals.

In the semiconductor nonvolatile memory device of the present invention, preferably the plurality of memory cells are arranged in a matrix form.

In the semiconductor nonvolatile memory device of the present invention, preferably a plurality of stacks of the first interconnection, first insulating film, and second interconnection are stacked while being insulated from each other, and in each stack, the plurality of memory cells are arranged in a matrix form so as to be connected to the first interconnection and the second interconnection.

In the semiconductor nonvolatile memory device of the present invention, the memory cell has the first interconnection, first insulating film formed on the first interconnection, opening formed in the first insulating film so as to reach the first interconnection, first semiconductor layer of a first conductivity type, second insulating film, and second semiconductor layer of a second conductivity type successively stacked in the opening from the first interconnection side, and the second interconnection formed connected to the second semiconductor layer.

By applying a predetermined voltage between the first semiconductor layer and the second semiconductor layer, the reproducibility and reliability are improved, and insulation breakage in the second insulating film can be caused.

Also, since the memory cell can be comprised by a simple structure, by making for example the row decoder and the column decoder by only pass transistors, the device can be produced while reducing the number of masks to about six, so the manufacturing cost can be suppressed.

Also, to attain the above object, a semiconductor nonvolatile memory device of the present invention has at least one memory cell and is programmable one time, wherein the memory cell comprises an impurity region of a first conductivity type formed in a first semiconductor layer on an insulating substrate, a first insulating film formed on the first semiconductor layer while covering the impurity region, an opening formed in the first insulating film so as to reach the impurity region, and a program portion comprising a second insulating film and a second semiconductor layer of a second conductivity type, the second insulating film and the second semiconductor layer being successively stacked in the opening, the second insulating film being formed on the impurity region, the second insulating film being changed in a conductive state in response to a program data to thereby electrically connect between the impurity region and the second semiconductor layer.

In the semiconductor nonvolatile memory device of the present invention, preferably the insulation breakage in the second insulating film in the program portion is caused by applying a predetermined voltage between the impurity region and the second semiconductor layer in response to the program data to be stored in the memory cell, and data is stored by the conduction or nonconduction between the impurity region and the second semiconductor layer in each memory cell.

In the semiconductor nonvolatile memory device of the present invention, preferably, in the memory cell, a gate electrode forming the word line is formed on the first semiconductor layer via a gate insulating film, a channel forming region is provided in the first semiconductor layer below the gate electrode, a field-effect transistor is formed using the impurity region as the drain region, and a bit line is connected to the second semiconductor layer.

More preferably the source region of the field-effect transistor is grounded.

Alternatively, more preferably, provision is further made of a means for detecting a current flowing from the source region of the field-effect transistor to the semiconductor substrate side.

Alternatively, more preferably, the word line and the bit line are connected to a row decoder and a column decoder including pass transistors for passing supplied signals therethrough, and more preferably, inverted signals of address signals are supplied to the row decoder and the column decoder from an external device together with forward signals.

In the semiconductor nonvolatile memory device of the present invention, preferably the plurality of memory cells are arranged in the matrix form.

In the semiconductor nonvolatile memory device of the present invention, preferably a plurality of the first semiconductor layers are stacked while being insulated from each other, and the memory cells are arranged in a matrix form in each of the first semiconductor layers.

In the semiconductor nonvolatile memory device of the present invention, the memory cell has an impurity region of a first conductivity type formed in the first semiconductor layer on the insulating substrate, a first insulating film formed on the first semiconductor layer while covering the impurity region, an opening formed in the first insulating film so as to reach the impurity region, and a second insulating film and second semiconductor layer of a second conductivity type successively stacked in the opening from the impurity region side.

By applying a predetermined voltage between the impurity region in the first semiconductor layer having an SOI (semiconductor on insulator) structure and the second semiconductor layer, the reproducibility and reliability can be improved in causing insulation breakage in the second insulating film.

Also, since the memory cell can be comprised by a simple structure, by making for example the row decoder and the column decoder by only pass transistors, the device can be produced while reducing the number of masks to about six, so the manufacturing cost can be suppressed.

To attain the above object, a method for production of a semiconductor nonvolatile memory device of the present invention is a method for production of a semiconductor nonvolatile memory device having at least one memory cell and programmable one time, wherein a process of forming the memory cell includes steps of forming an impurity region of a first conductivity type in a semiconductor substrate, forming a first insulating film on the semiconductor substrate while covering the impurity region, forming an opening in the first insulating film so as to reach the impurity region, forming a first semiconductor layer of a first conductivity type on the impurity region in the opening, forming a second insulating film on the first semiconductor layer in the opening, and forming a second semiconductor layer of a second conductivity type on the second insulating film in the opening.

In the method for production of a semiconductor nonvolatile memory device of the present invention, preferably the step of forming the first semiconductor layer is a step of forming the same by selective epitaxial growth.

In the method for production of a semiconductor nonvolatile memory device of the present invention, preferably a step of forming a gate electrode acting as a word line on the semiconductor substrate acting as a channel forming region via a gate insulating film is provided before the step of forming the impurity region of the first conductivity type on the semiconductor substrate, and in the step of forming the impurity region of the first conductivity type on the semiconductor substrate, in the semiconductor substrate on both side portions of the gate electrode a source region and a drain region acting as the impurity region are formed, and provision is further made of a step of forming a bit line at an upper layer of the second semiconductor layer.

More preferably, the row decoder and the column decoder connected to the word line and the bit line are formed by only pass transistors.

In the method for production of the semiconductor nonvolatile memory device of the present invention, when forming memory cells arranged in a matrix form or the like, the impurity region of the first conductivity type is formed on the semiconductor substrate, the first insulating film is formed on the semiconductor substrate while covering the impurity region, and the opening is formed in the first insulating film so as to reach the impurity region. Next, in the opening, the first semiconductor layer of the first conductivity type is formed on the impurity region, the second insulating film is formed on the first semiconductor layer, and further the second semiconductor layer of the second conductivity type is formed on the second insulating film.

According to the method for production of a semiconductor nonvolatile memory device of the present invention, it is possible to produce a semiconductor nonvolatile memory device having memory cells capable of improving reproducibility and reliability in causing insulation breakage in a second insulating film by applying a predetermined voltage between the first semiconductor layer and the second semiconductor layer, For example, by making for example the row decoder and the column decoder by only pass transistors, it is possible to produce the device while reducing the number of masks to about six and to suppress the manufacturing cost.

To attain the above object, a method for production of a semiconductor nonvolatile memory device of the present invention is a method for production of a semiconductor nonvolatile memory device having at least one memory cell and programmable one time, wherein a process of forming the memory cell includes steps of forming a first insulating film at an upper layer of a first interconnection, forming an opening in the first insulating film so as to reach the first interconnection, forming a first semiconductor layer of a first conductivity type on the first interconnection in the opening, forming a second insulating film on the first semiconductor layer in the opening, forming a second semiconductor layer of a second conductivity type on the second insulating film in the opening, and forming a second interconnection so as to be connected to the second semiconductor layer.

In the method for production of a semiconductor nonvolatile memory device of the present invention, preferably the first interconnection is formed as a word line, and the second interconnection is formed as a bit line.

More preferably, the row decoder and the column decoder connected to the word line and the bit line are formed by only pass transistors.

In the method for production of a semiconductor nonvolatile memory device of the present invention, when forming memory cells arranged in a matrix form, the first insulating film is formed at an upper layer of the first interconnection, the opening is opened in the first insulating film so as to reach the first interconnection, the first semiconductor layer of the first conductivity type is formed on the first interconnection in the opening, the second insulating film is formed on the first semiconductor layer, and further the second semiconductor layer of the second conductivity type is formed on the second insulating film. Next, the second interconnection is formed so as to be connected to the second semiconductor layer.

According to the method for production of a semiconductor nonvolatile memory device of the present invention, it is possible to produce a semiconductor nonvolatile memory device having memory cells capable of improving reproducibility and reliability in causing insulation breakage in a second insulating film by applying a predetermined voltage between the first semiconductor layer and the second semiconductor layer. For example, by making the row decoder and the column decoder by only pass transistors, it is possible to produce the device while reducing the number of masks to about six and to suppress the manufacturing cost.

To attain the above object, a method for production of a semiconductor nonvolatile memory device of the present invention is a method for production of a semiconductor nonvolatile memory device having at least one memory cell and programmable one time, wherein a process of forming the memory cell includes steps of forming an impurity region of a first conductivity type in a first semiconductor layer on an insulating substrate, forming a first insulating film on the first semiconductor layer while covering the impurity region, forming an opening in the first insulating film so as to reach the impurity region, forming a second insulating film on the impurity region in the opening, and forming a second semiconductor layer of a second conductivity type on the second insulating film in the opening.

In the method for production of the semiconductor nonvolatile memory device of the present invention, preferably a step of forming a gate electrode acting as a word line on the first semiconductor layer acting as a channel forming region via a gate insulating film is provided before the step of forming the impurity region of the first conductivity type in the first semiconductor layer, and in the step of forming the impurity region of the first conductivity type in the first semiconductor layer, in the first semiconductor layer on both side portions of the gate electrode a source region and a drain region acting as the impurity region are formed, and provision is further made of a step of forming a bit line at an upper layer of the second semiconductor layer.

More preferably the row decoder and the column decoder connected to the word line and the bit line are formed by only pass transistors.

In the method for production of the semiconductor nonvolatile memory device of the present invention, when forming memory cells arranged in a matrix form or the like, the impurity region of the first conductivity type is formed in the first semiconductor layer on the insulating substrate, the first insulating film is formed on the first semiconductor layer while covering the impurity region, and the opening is formed in the first insulating film so as to reach the impurity region. Next, in the opening, the second insulating film is formed on the impurity region, and the second semiconductor layer of the second conductivity type is formed on the second insulating film.

According to the method for production of a semiconductor nonvolatile memory device of the present invention, it is possible to produce a semiconductor nonvolatile memory device having memory cells capable of improving reproducibility and reliability in causing insulation breakage in a second insulating film by applying a predetermined voltage between the impurity region and the second semiconductor layer. By making for example the row decoder and the column decoder by only pass transistors, it is possible to produce the device while reducing the number of masks to about six and suppress the manufacturing cost.

BRIEF DESCRIPTION OF THE DRAWINGS

These and other objects and features of the present invention will become clearer from the following description of the preferred embodiments given with reference to the accompanying drawings, in which:

FIGS. 11A and 11B are sectional views in a method for production of a semiconductor nonvolatile memory device (memory chip) according to the first embodiment, in which FIG. 11A shows up to an element isolation step, and FIG. 11B shows up to a step of forming a gate electrode use layer;

FIGS. 12A and 12B are sectional views showing steps continuing from FIGS. 11A and 11B, in which FIG. 12A shows up to a patterning step of the gate electrode, and FIG. 12B shows up to a step of forming a source and drain region;

FIGS. 13A and 13B are sectional views of steps continuing from FIGS. 12A and 12B, in which FIG. 13A shows up to a step of forming a contact hole, and FIG. 13B shows up to a step of forming a first semiconductor layer;

FIGS. 14A and 14B are sectional views showing steps continuing from FIGS. 13A and 13B, in which FIG. 14A shows up to a step of forming a second insulating film, and FIG. 14B shows up to a step of forming a second semiconductor layer;

DESCRIPTION OF THE PREFERRED EMBODIMENTS

Figure 1:
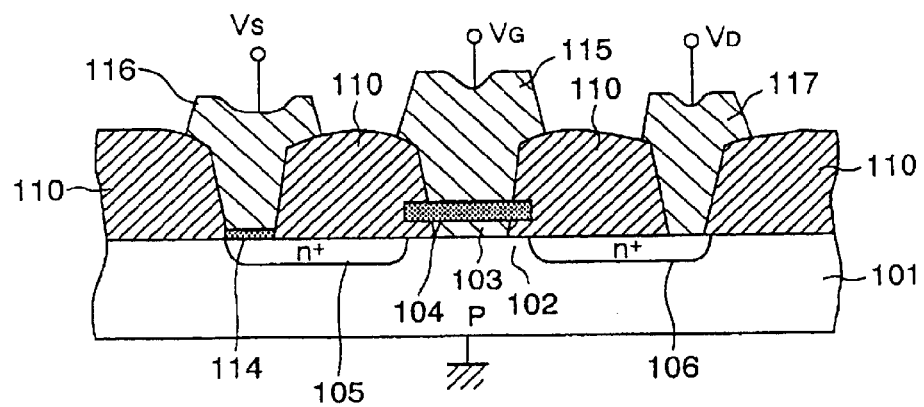
FIG. 1 is a sectional view of a semiconductor nonvolatile memory device according to a first conventional example.
Figure 2:
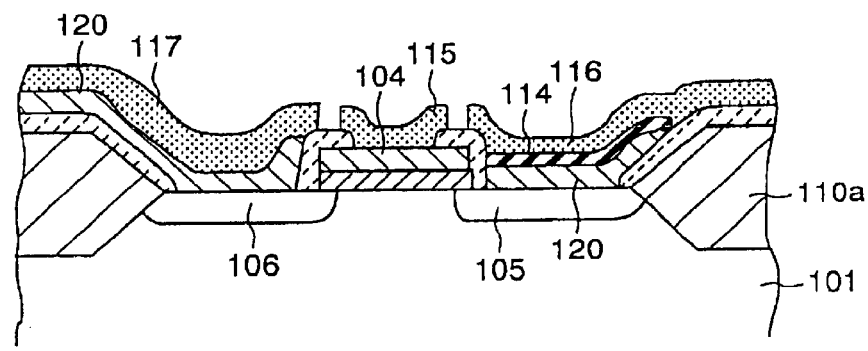
FIG. 2 is a sectional view of a semiconductor nonvolatile memory device according to a second conventional example.
Figure 3:
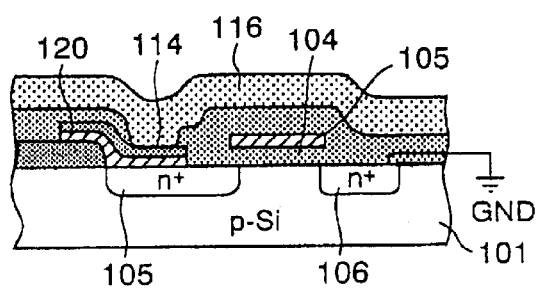
FIG. 3 is a sectional view of a semiconductor nonvolatile memory device according to a third conventional example.
Figure 4A:
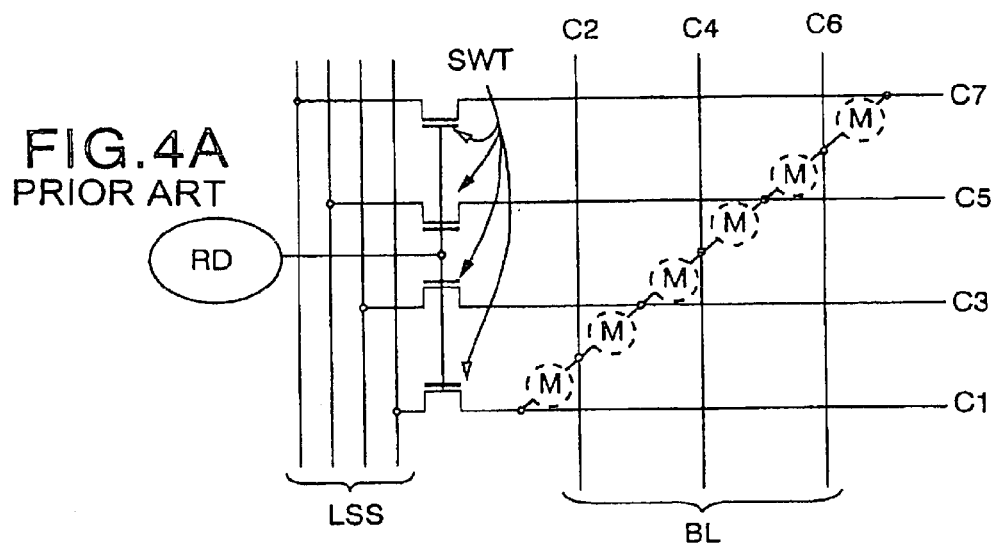
FIG. 4A is a circuit diagram of a semiconductor nonvolatile memory device according to a fourth conventional example.
Figure 4B:
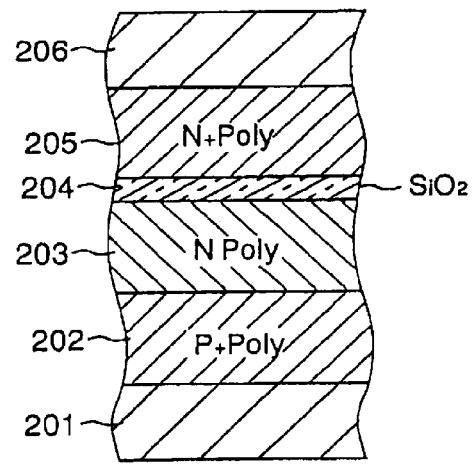
FIG. 4B is a sectional view of the memory cell.

Below, an explanation will be made of a semiconductor nonvolatile memory device of the present invention and a method for production of the same by referring to the drawings.

First Embodiment

Figure 5:
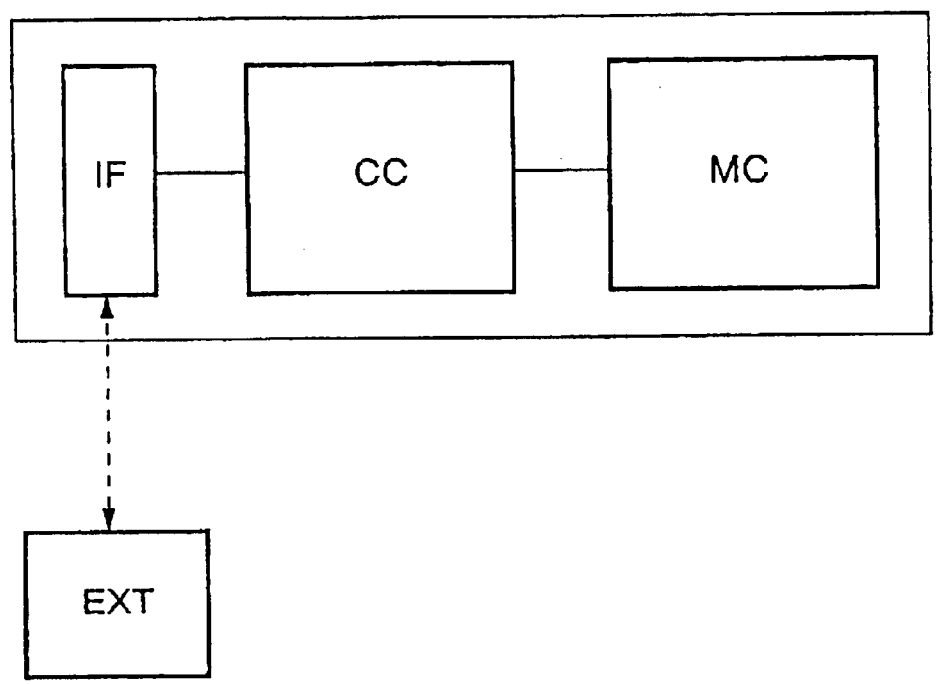
FIG. 5 is a schematic view of the configuration of storage medium (memory card) with a built-in semiconductor nonvolatile memory device (memory chip) according to a first embodiment.

FIG. 5 is a schematic view of the configuration of storage medium (memory card) with a built-in memory chip as a semiconductor nonvolatile memory device according to the present embodiment.

The storage medium has a memory chip MC, a control chip CC, and an interface IF.

The control chip CC receives power and receives data from an external higher apparatus EXT via an interface IF and writes and reads the data with respect to the memory chip MC.

Figure 6:
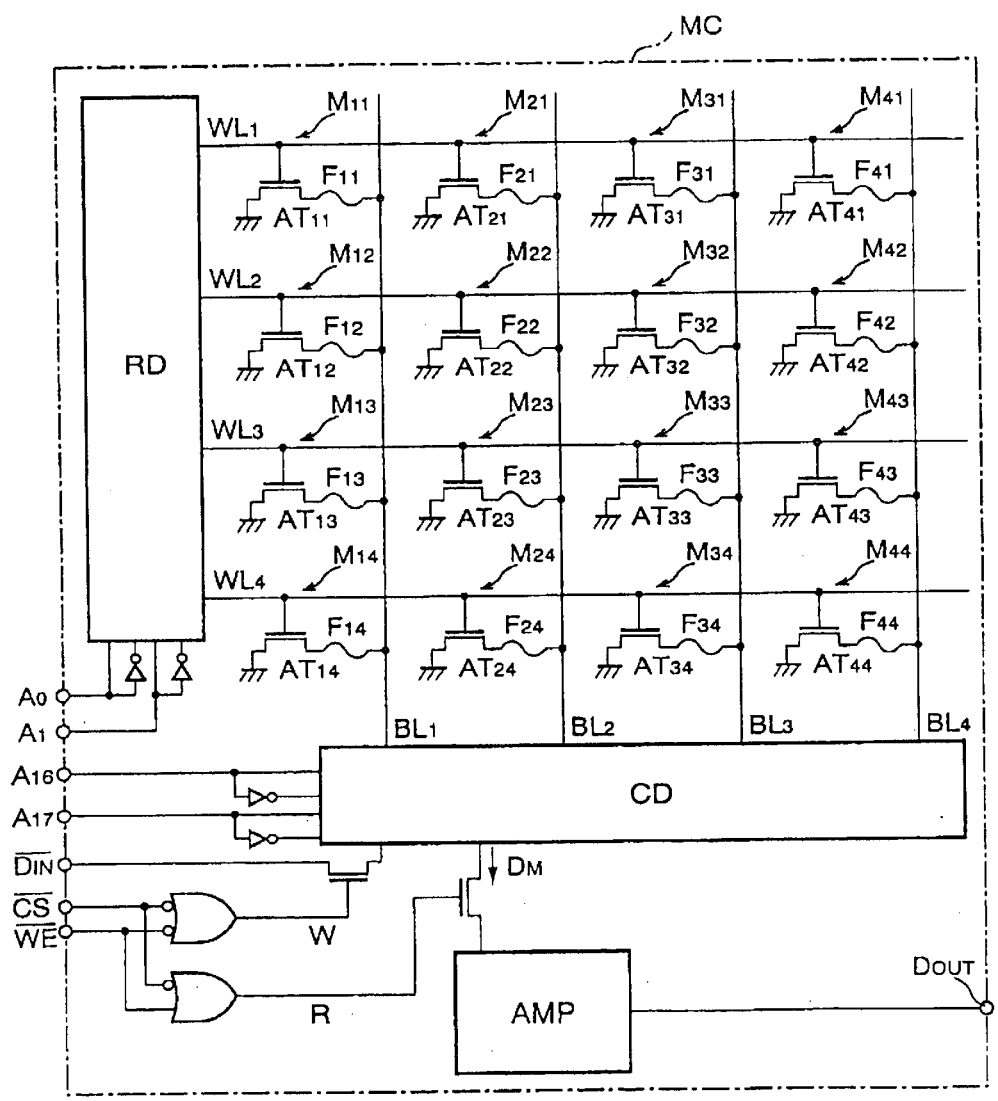
FIG. 6 is a circuit diagram of the configuration of the memory chip according to the first embodiment.

FIG. 6 is a circuit diagram of the configuration of the memory chip MC. For simplification of the explanation, a memory cell array of 4 rows and 4 columns is explained, but in actuality, the invention can be applied to a memory cell array of m number of rows and n number of columns.

The memory chip MC has a row decoder RD, a column decoder CD, a memory cell array, and an output circuit.

In the memory cell array, memory cells M ($M_{11}, M_{12}, \ldots, M_{34}, M_{44}$) are arranged in a matrix form at positions where word lines WL ($WL_1, WL_2, WL_3, WL_4$) connected to the row decoder RD and bit lines BL ($BL_1, BL_2, BL_3, BL_4$) connected to the column decoder CD intersect.

The memory cells M have access transistors AT ($AT_{11}, AT_{12}, \ldots, AT_{34}, AT_{44}$) and insulating film breakage type fuses F ($F_{11}, F_{12}, \ldots, F_{34}, F_{44}$).

The source regions of the access transistors AT ($AT_{11}, AT_{12}, \ldots, AT_{34}, AT_{44}$) are connected to the bit lines BL ($BL_1, BL_2, BL_3, BL_4$), and the drain regions are grounded.

Figure 7:
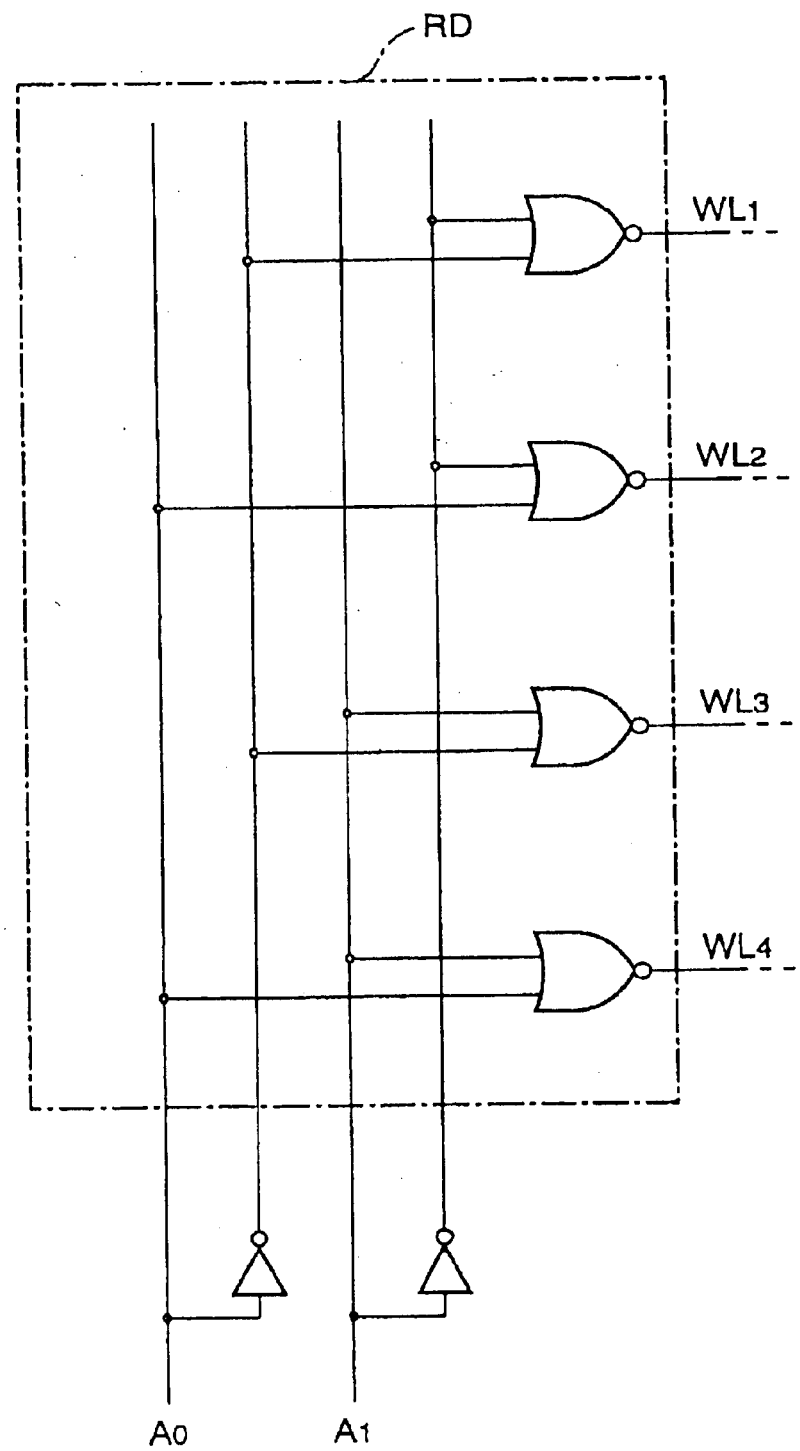
FIG. 7 is an equivalent circuit diagram of an example of the configuration of a row decoder of the memory chip according to the first embodiment.

FIG. 7 is an equivalent circuit diagram of an example of the configuration of the row decoder RD.

In the row decoder RD, for example a voltage $V_{dd}$ is supplied to word lines WL ($WL_1, WL_2, WL_3, WL_4$) selected by OR logic circuits with address data $A_i$ ($A_0, \underline{A}_0, A_1, \underline{A}_1 \ldots$) input thereto or other circuits.

Alternatively, the row decoder RD may be comprised of only a pass transistor controlled by the address data $A_i$ ($A_0, \underline{A}_0, A_1, \underline{A}_1 \ldots$) and a not illustrated block selection signal $\phi$, and for example the voltage $V_{dd}$ may be supplied to the word line WL selected by the address data and the block selection signal. In this case, preferably the address data $A_i$ ($A_0, \underline{A}_0, A_1, \underline{A}_1 \ldots$), etc. are supplied from the control chip CC.

Figure 8:
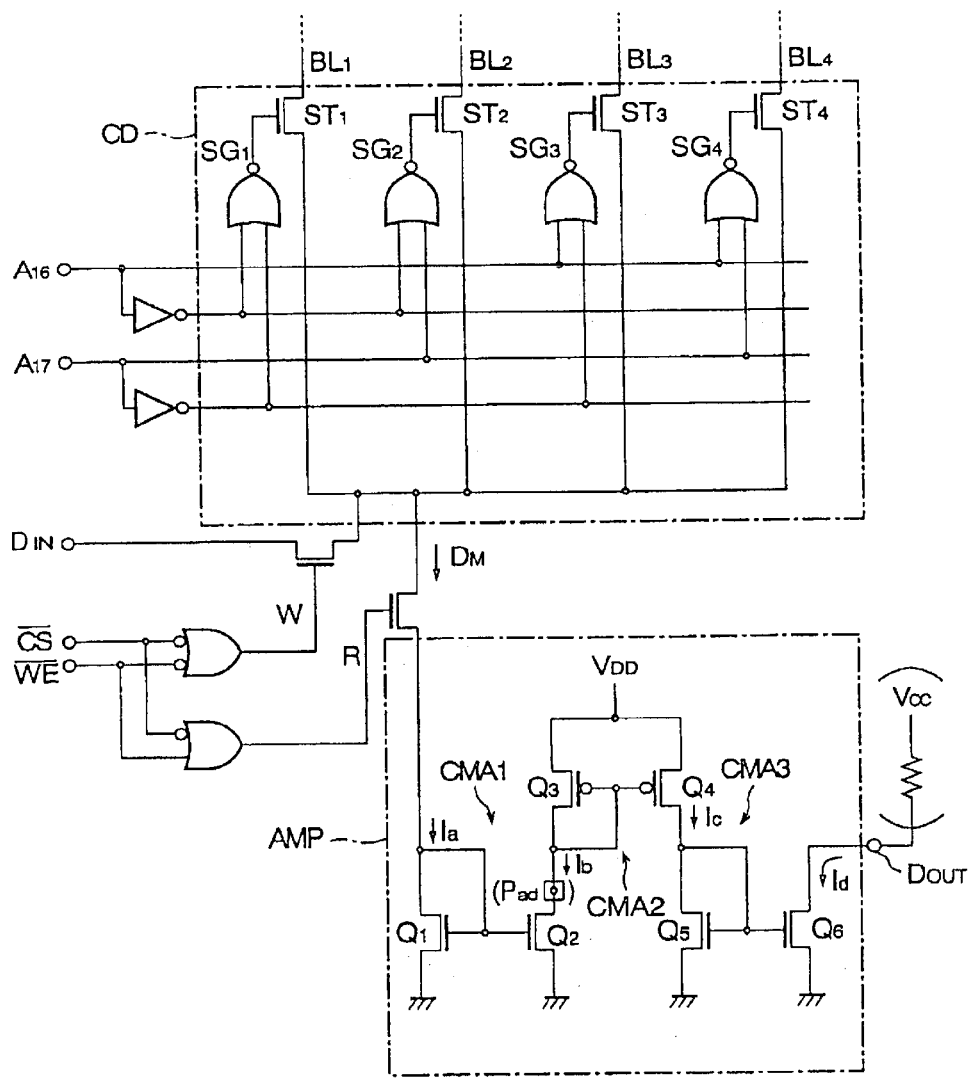
FIG. 8 is an equivalent circuit diagram of an example of the configuration of an output system including a column decoder and an amplifier according to the first embodiment.

FIG. 8 is an equivalent circuit diagram of an example of the configuration of an output system including a column decoder CD and an amplifier.

In the column decoder CD, in the same way as the row decoder RD, the bit line BL selected by the selection transistors ST ($ST_1$, $ST_2$, $ST_3$, $ST_4$) having the OR logic circuits with address data $A_i$ ($A_{16}$, $\underline{A}_{16}$, $A_{17}$, $\underline{A}_{17}$ ...) input thereto and having selection gates SG ($SG_1$, $SG_2$, $SG_3$, $SG_4$) receives as input for example an input data $D_{IN}$ when for example a write signal W obtained from a chip select signal CS and a write enable signal WE becomes ON. Alternatively, memory cell data $D_M$ is read from the bit line BL when for example a read signal R obtained from the chip select signal CS and the write enable signal WE becomes ON.

Alternatively, the column decoder CD may be comprised of only pass transistors controlled by the address data $A_i$ ($A_{16}$, $\underline{A}_{16}$, $A_{17}$, $\underline{A}_{17}$ ... and the not illustrated block selection signal $\phi$, the input data DIN may be input to the bit line BL selected by the address data and the block selection signal as described above, or the memory cell data DM may be read from the selected bit line BL. In this case, preferably the address data $A_i$ ($A_{16}$, $\underline{A}_{16}$, $A_{17}$, $\underline{A}_{17}$...), block selection signal $\phi$, the input data $D_{IN}$ etc. are supplied from the control chip CC.

An amplifier AMP is comprised of for example three current mirror amplifiers (CMA1, CMA2, CMA3). Each current mirror amplifier is comprised of two transistors ($Q_1$, $Q_2$, $Q_3$, $Q_4$, $Q_5$, $Q_6$).

Here, the transistors ($Q_1$, $Q_2$, $Q_5$, $Q_6$) are comprised of n-channel MOS transistors (NMOS), while the transistors ($Q_3$, $Q_4$) are comprised of p-channel MOS transistors.

Here, for example, preferably the circuits up to the transistors ($Q_1$, $Q_2$) are arranged on the memory chip MC, the transistors ($Q_3$, $Q_4$, $Q_5$, $Q_6$) and following circuits are arranged on the control chip CC, and the transistors ($Q_2$, $Q_3$) are connected by a pad PAD.

When a current $I_a$ in accordance with the memory cell data $D_M$ output from the memory cell array is input to the first current mirror amplifier CMA1, a current $I_b$ amplified in accordance with a ratio of channel widths of the transistors ($Q_1$, $Q_2$) comprising the first current mirror amplifier CMA1 flows to the transistor $Q_2$ side.

The current $I_b$ is amplified to a current $I_c$ by a similar operation also in the second current mirror amplifier CMA2, while the current $I_c$ is amplified to a current $I_d$ in the third current mirror amplifier CMA3.

For example, when the ratio of channel widths of the transistors is set so that the current is amplified 10-fold for every stage, the current can be amplified $10^3$=1000-fold.

By extracting the current amplified as described above from $D_{OUT}$ as it is as the output data or connecting an external resistor with a voltage $V_{cc}$ applied thereto, the current is converted to voltage and can be extracted as the output data.

Figure 9A:
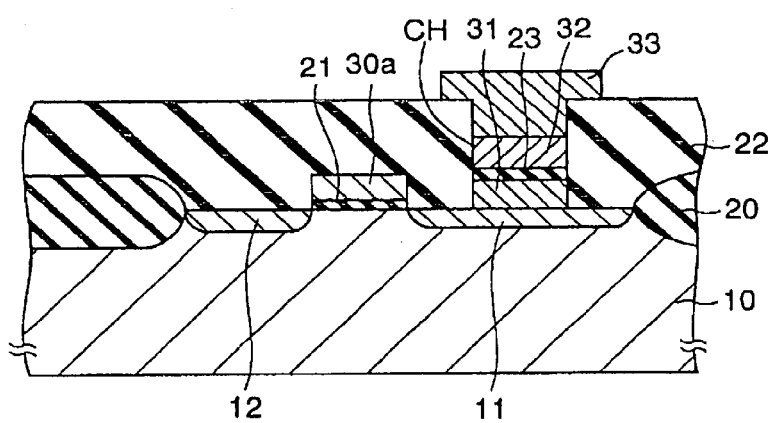
FIG. 9A is a sectional view of a memory cell according to the first embodiment.
Figure 9B:
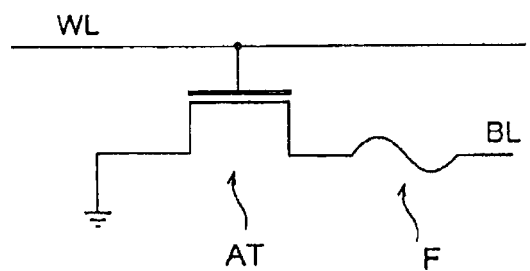
FIG. 9B is a corresponding equivalent circuit diagram.

FIG. 9A is a sectional view of the memory cell, while FIG. 9B is a corresponding equivalent circuit diagram.

For example, a gate insulating film 21 of silicon oxide is formed on the channel forming region in the active region isolated by an element isolation insulating film 20 of a p-type silicon semiconductor substrate 10, and a gate electrode 30a made of polysilicon and acting as the word line WL is formed at an upper layer thereof.

A source region 11 and a drain region 12 containing n-type impurities with a high concentration are formed in the semiconductor substrate 10 on the two side portions of the gate electrode 30a.

The n-channel MOS transistor acting as the access transistor AT of the memory cell is comprised as described above.

A channel length of the transistor is set at for example about 0.1 $\mu$m, and a junction depth of the source and drain region is set at for example about 0.05 $\mu$m.

A first insulating film 22 of for example silicon oxide is formed over the entire surface covering the n-channel MOS transistor, and a contact hole CH is formed reaching the source region 11.

In the contact hole CH, a first semiconductor layer 31 made of crystalline silicon formed by epitaxial growth and containing the n-type impurity with a high concentration is formed while connected to the source region 11, a second insulating film 23 of silicon oxide is formed at an upper layer thereof, and a second semiconductor layer 32 made of polysilicon containing the p-type impurity with a high concentration is formed at an upper layer thereof. A total thickness of the first semiconductor layer 31, second insulating film 23, and second semiconductor layer 32 is made an extent that does not reach the depth of the contact hole CH.

Also, an upper layer interconnection 33 made of an aluminum or other metal interconnection and acting as the bit line BL is formed connected to the second semiconductor layer 32.

On the other hand, the drain region 12 is grounded by an interconnection or the like in the semiconductor substrate 10.

In each memory cell having the above structure, the stack of the first semiconductor layer 31, second insulating film 23, and second semiconductor layer 32 becomes an insulating film breakage type fuse F, that is, a programmable portion. By applying a predetermined high voltage between the first semiconductor layer 31 and the second semiconductor layer 32 of the memory cell selected so as to correspond to the data to be stored, insulation breakage in the second insulating film 23 is caused and the first semiconductor layer 31 and the second semiconductor layer 32 are made conductive. Therefore, data can be stored by the conduction or nonconduction between the first semiconductor layer 31 and the second semiconductor layer 32 in each memory cell.

Usually, after causing the insulation breakage in the second insulating film 23 as described above, the conduction between the first semiconductor layer 31 and the second semiconductor layer 32 is confirmed to confirm that the writing succeeds.

Figure 10:
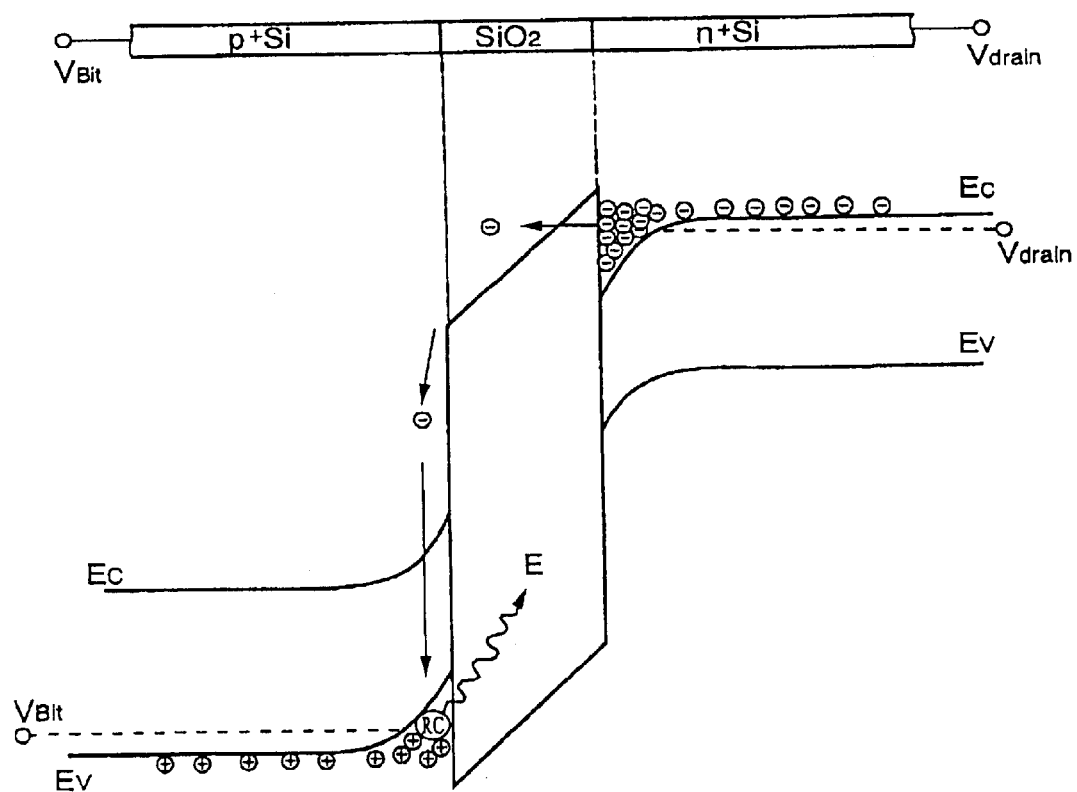
FIG. 10 is an energy band diagram for explaining an insulation breakage in a second insulating film of the memory cell according to the first embodiment.

FIG. 10 is an energy band diagram for explaining the insulation breakage in the second insulating film 23.

When a drain voltage $V_{drain}$ is applied to the $n^+$ type first semiconductor layer 31, and a bit voltage $V_{Bit}$ is applied to the $p^+$ type second semiconductor layer 32, an energy difference between a valence electron band level $E_V$ and a Fermi level $E_C$ in the layers of the $n^+$ type layer and the $p^+$ type layer is generated so as to correspond to the voltage difference between $V_{drain}$ and $V_{Bit}$.

The energy level in the vicinity of the interface between the $n^+$ type layer ($n^+$Si) and the $p^+$ type layer ($p^+$ Si) and the oxide film ($SiO_2$) smoothly varies and exhibits a quantum well state with respect to the electrons (indicated by—in the figure) and the holes (indicated by+in the figure) in the $n^+$ type layer and the $p^+$ type layer, therefore the electrons and the holes are accumulated in the vicinity of the interface of the n+ type and the p+ type layer and the oxide film.

When the voltage difference between $V_{drain}$ and $V_{Bit}$ becomes a predetermined value or more, the energy difference of the accumulated carriers becomes large, electrons pass through an energy barrier formed by the oxide film by A tunnel effect and recombine (indicated by RC in the figure), an energy E such as heat is generated and transferred to the oxide film, and the insulation breakage of the oxide film is caused.

For example in the case of a structure without the first semiconductor layer 31, the influence of the insulation breakage reaches up to the lower portion of the source region at a shallow junction depth, and sometimes becomes the cause of junction leakage, but in the present structure, the influence of the insulation breakage-can be prevented from reaching up to the lower portion of the source region by the existence of the first semiconductor layer 31.

In the stacked structure of the first semiconductor layer 31, second insulating film 23, and second semiconductor layer 32, the energy E by the recombination RC of electrons and holes is efficiently transferred to the oxide film, so the reproducibility and the Are liability can be improved and thus the insulation breakage in the second insulating film can be caused. The thickness of the second insulating film 23 would be a few nanometer thick, and the break down voltage would be around 10 to 15 volt.

In order to read out the data stored in the memory cell as described above, for example the bit line connected to the memory cell to be read is precharged to a predetermined value, the word line connected to the memory cell to be similarly read out is made ON to make the access transistor of the related memory cell ON, and the conduction or nonconduction between the first semiconductor layer 31 and the second semiconductor layer 32 in each memory cell is checked according to if the precharge of the bit line fluctuates in potential to thereby obtain the read data.

The semiconductor nonvolatile memory device (memory chip) according to the present embodiment has a simple configuration where, in the memory cell array, each memory cell has one n-channel MOS transistor (NMOS) and one insulating film breakage type fuse. The semiconductor nonvolatile memory device (memory chip) can be easily and cheaply produced by improving the reproducibility and reliability of the insulating film breakage of the silicon oxide film.

Also, by using the semiconductor nonvolatile memory device (memory chip) of the present embodiment in combination with the control chip as shown in FIG. 5, the PMOS (p-channel MOS transistor) required for the circuit configuration of the decoder and the amplifier can be provided not on the memory chip but on the control chip. Namely, by employing the configuration wherein the row decoder and the column decoder are comprised of only pass transistors (NMOS) or the like, it becomes possible to form the memory chip per se by the NMOS process, and it is possible to produce the same while reducing the number of masks to for example about six. Therefore, the manufacturing cost of the memory chip can be greatly reduced.

On the other hand, the control chip per se is originally produced by the COMS process, so the cost will not largely increase.

Accordingly, due to the great reduction of the cost of the memory chip, the manufacturing cost of the storage medium (memory card) with the built-in memory chip can be reduced.

An explanation will be made of the method for production of a semiconductor nonvolatile memory device (memory chip) having the memory cell of the above structure by referring to the drawings.

Figure 11A:
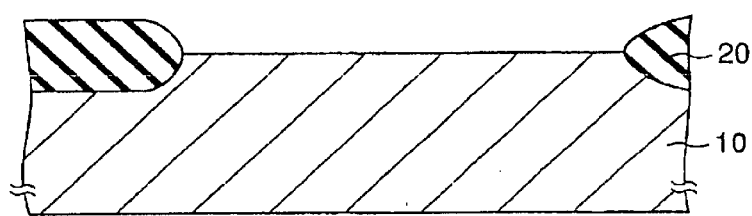

First, as shown in FIG. 11A, an element isolation insulating film 20 is formed on a p-type silicon semiconductor substrate 10 by LOCOS or the like. Further, a conductive impurity is ion-implanted into the active region isolated by the element isolation insulating film 20 for threshold adjustment or the like.

Figure 11B:
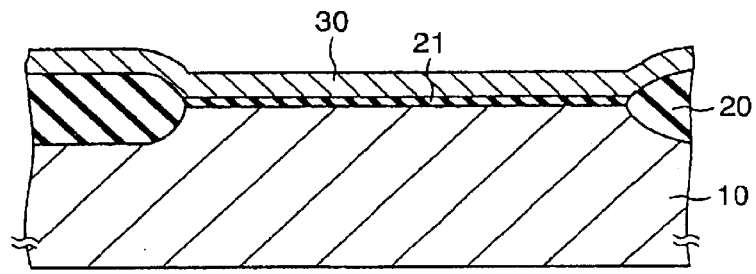

Next, as shown in FIG. 11B, the surface of the semiconductor substrate 10 is oxidized by for example thermal oxidation to thereby form the gate insulating film 21.

Further, polysilicon is stacked by CVD (chemical vapor deposition) to form a gate electrode use layer 30.

Figure 12A:
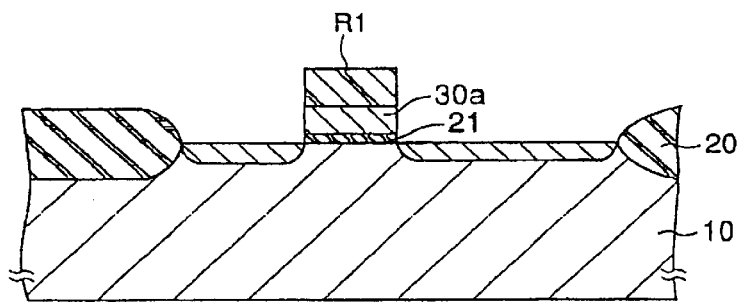

Next, as shown in FIG. 12A, a resist film R1 of a pattern of the gate electrode is formed by photolithography, etching such as RIE (reactive ion etching) is applied with this resist film R1 as a mask, and the gate electrode use layer 30 and the gate insulating film 21 are patterned to thereby form the gate electrode 30a.

Figure 12B:
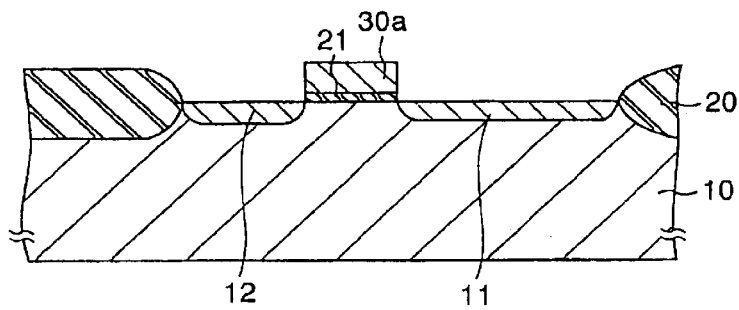

Next, as shown in FIG. 12B, an n-type conductive impurity is ion-implanted to thereby form the source region 11 and the drain region 12 in the semiconductor substrate 10 on the two sides of the gate electrode 30a.

The n-channel MOS transistor (NMOS) is formed by this.

Figure 13A:
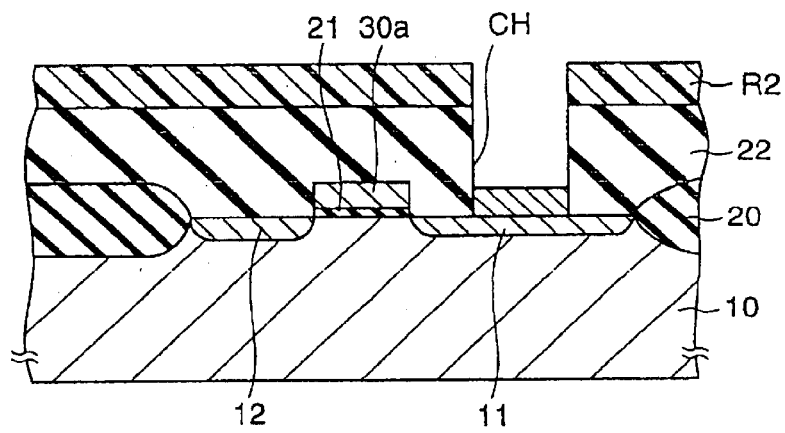

Next, as shown in FIG. 13A, silicon oxide is stacked over the entire surface covering the NMOS by for example CVD to form the first insulating film 22, a resist film R2 of the opening pattern of the contact hole is patterned by photolithography, and etching such as RIE is applied using this resist film R2 as a mask to form the contact hole CH reaching the source region 11.

Figure 13B:
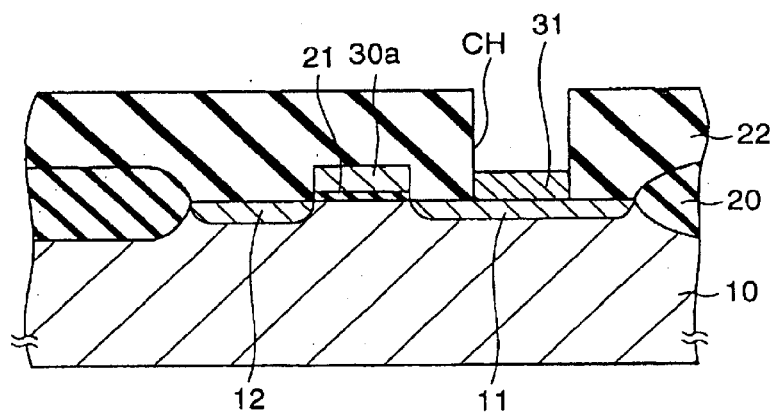

Next, as shown in FIG. 13B, the first semiconductor layer 31 containing the n-type conductive impurity with a high concentration is selectively formed in the contact hole CH so as to be connected to the source region 11 by selective epitaxial growth by for example MOCVD (metal organic chemical vapor deposition) process.

Figure 14A:
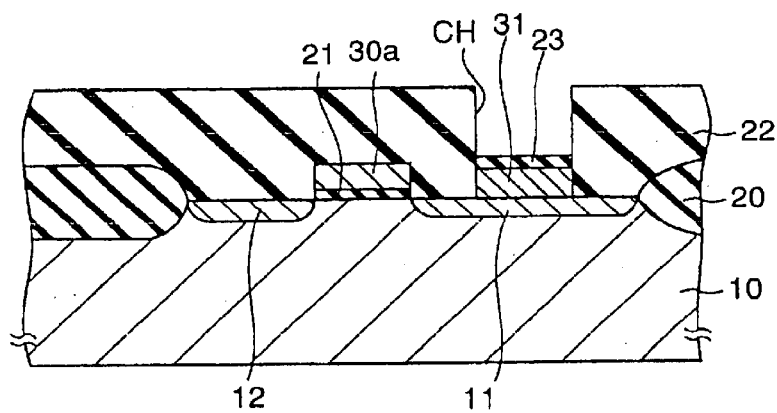

Next, as shown in FIG. 14A, the surface layer of the first semiconductor layer 31 is oxidized by for example thermal oxidation, or silicon oxide is stacked by CVD, to thereby form the second insulating film 23.

The silicon oxide is stacked over the entire surface in the case of CVD, but the illustration of the external portion of the contact hole CH is omitted.

Figure 14B:
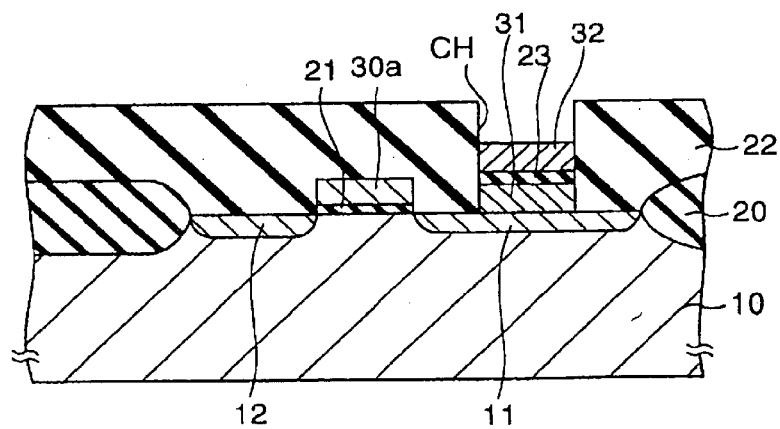

Next, as shown in FIG. 14B, polysilicon is stacked over the entire surface by for example CVD, a resist film (not illustrated) protecting the contact hole portion is formed by photolithography, and RIE or other etching is applied to eliminate the polysilicon on the outside of the contact hole to thereby form the second semiconductor layer 32 containing the p-type conductive impurity with a high concentration at an upper layer of the second insulating film 23.

As the following steps, the upper layer interconnection 33 made of the aluminum or other metal interconnection and acting as the bit line is patterned so as to be connected to the second semiconductor layer 32 formed as described above, whereby thus the semiconductor nonvolatile memory device shown in FIGS. 9A and 9B is reached.

According to the method for production of a semiconductor nonvolatile memory device of the present embodiment, it is possible to easily produce the semiconductor nonvolatile memory device according to the present embodiment. By applying a predetermined voltage between the first semiconductor layer and the second semiconductor layer, the reproducibility and reliability are improved, and thus a semiconductor nonvolatile memory device having a memory cell capable of causing insulation breakage in the second insulating film can be produced.

Particularly, where the row decoder, column decoder, etc. are comprised of only pass transistors, the device can be formed by the NMOS process, so production is possible while reducing the number of masks to about six, and the manufacturing cost can be suppressed.

Second Embodiment

Figure 15:
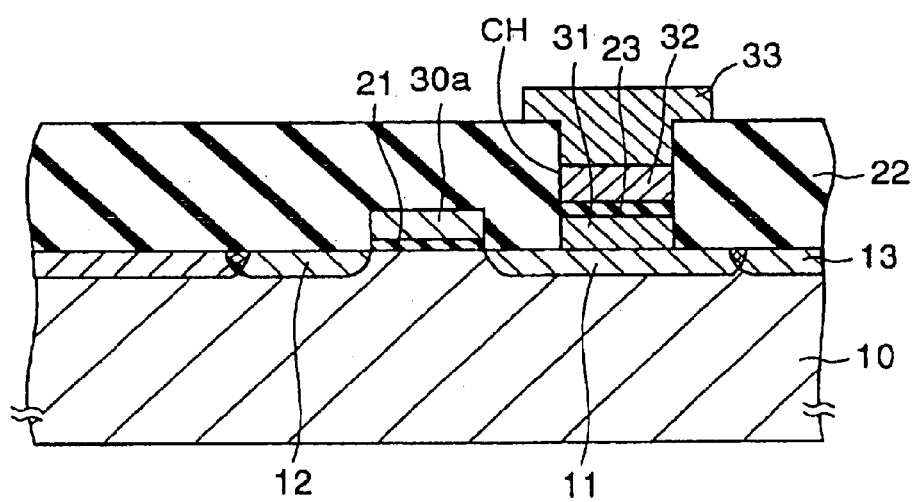
FIG. 15 is a sectional view of the memory cell of a semiconductor nonvolatile memory device according to a second embodiment.

In the semiconductor nonvolatile memory device (memory chip) according to the present embodiment, as shown in the sectional view of FIG. 15, in the structure of each memory cell, the p-type silicon semiconductor substrate 10 is isolated by the $p^+$ type element isolation region 13 containing the p-type impurity with a high concentration.

The rest of the configuration is substantially the same as that of the first embodiment.

Namely, the gate insulating film 21 and the gate electrode 30a acting as the word line WL are formed on the channel forming region in the active region isolated by the element isolation region 13, the source region 11 and the drain region 12 are formed in the semiconductor substrate 10 on the two sides of the gate electrode 30a, and thus an n-channel MOS transistor acting as the access transistor AT of the memory cell is comprised.

Further, a first insulating film 22 of for example silicon oxide is formed over the entire surface while covering the n-channel MOS transistor, the contact hole CH reaching the source region 11 is opened, the first semiconductor layer 31, second insulating film 23, and second semiconductor layer 32 are stacked in the contact hole CH, and an upper layer interconnection 33 made of aluminum or other metal interconnection and acting as the bit line BL is formed while being connected to the second semiconductor layer 32.

The semiconductor nonvolatile memory device (memory chip) according to the present embodiment has a simple configuration where, in the memory cell array, each memory cell has one n-channel MOS transistor (NMOS) and one insulating film breakage type fuse F, that is, a programmable portion. The semiconductor nonvolatile memory device (memory chip) can be easily and cheaply produced by improving the reproducibility and reliability of the insulating film breakage of the silicon oxide film.

Also, in the semiconductor nonvolatile memory device (memory chip) of the present embodiment, in the same way as the first embodiment, it becomes possible to form the memory chip per se by the NMOS process by employing a configuration wherein the row decoder and the column decoder are comprised of only pass transistors (NMOS) and it is possible to produce the same while reducing the number of masks to for example about six. Therefore the manufacturing cost of the memory chip can be greatly reduced.

Third Embodiment

Figure 16:
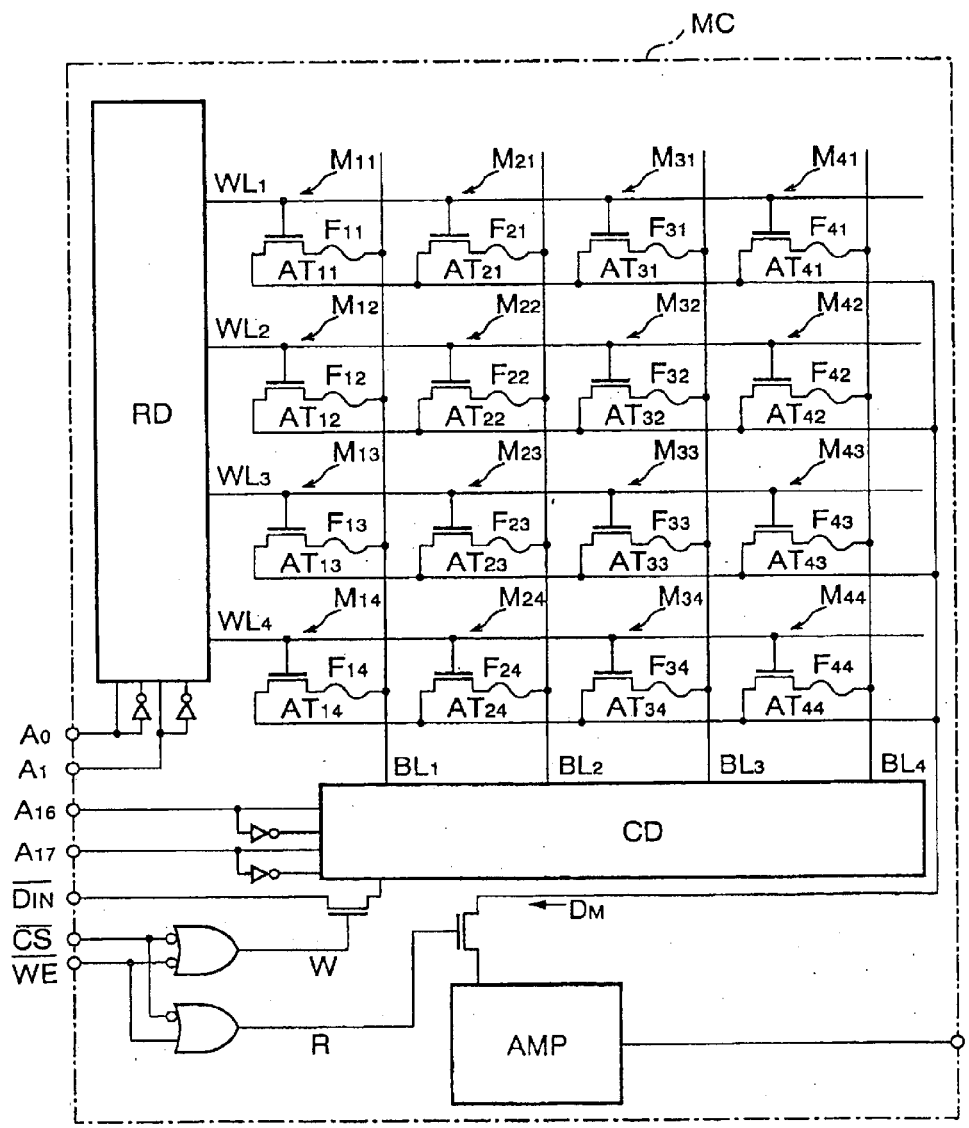
FIG. 16 is a circuit diagram of the configuration of a semiconductor nonvolatile memory device (memory chip) according to a third embodiment.

The semiconductor nonvolatile memory device (memory chip) according to the present invention embodiment is different in configuration in that, as shown in the equivalent circuit diagram of FIG. 16, in the memory cell array, the source regions of the access transistors AT ($AT_{11}$, $AT_{12}$, ..., $AT_{34}$, $AT_{44}$) of the memory cells are connected to the bit lines BL ($BL_1$, $BL_2$, $BL_3$, $BL_4$), while the current flowing to the substrate from the drain region is detected as the memory cell output data $D_M$, and connected to the amplifier AMP.

The rest of the configuration is substantially the same as that of the first embodiment.

For example, the amplifier AMP receiving the memory cell output data DM is configured comprised of the three current mirror amplifiers (CMA1, CMA2, CMA3) explained in the first embodiment.

The semiconductor nonvolatile memory device (memory chip) according to the present embodiment has a simple configuration where, in the memory cell array, each memory cell has one n-channel MOS transistor (NMOS) and one insulating film breakage type fuse. The semiconductor nonvolatile memory device (memory chip) can be easily and cheaply produced by improving the reproducibility and reliability of the insulating film breakage of the silicon oxide film.

Also, in the semiconductor nonvolatile memory device (memory chip) of the present embodiment, in the same way as the first embodiment, it becomes possible to form the memory chip per se by the NMOS process by employing a configuration wherein the row decoder and the column decoder are comprised of only pass transistors (NMOS) and it is possible to produce the same while reducing the number of masks to for example about six. Therefore the manufacturing cost of the memory chip can be greatly reduced.

Fourth Embodiment

Figure 17:
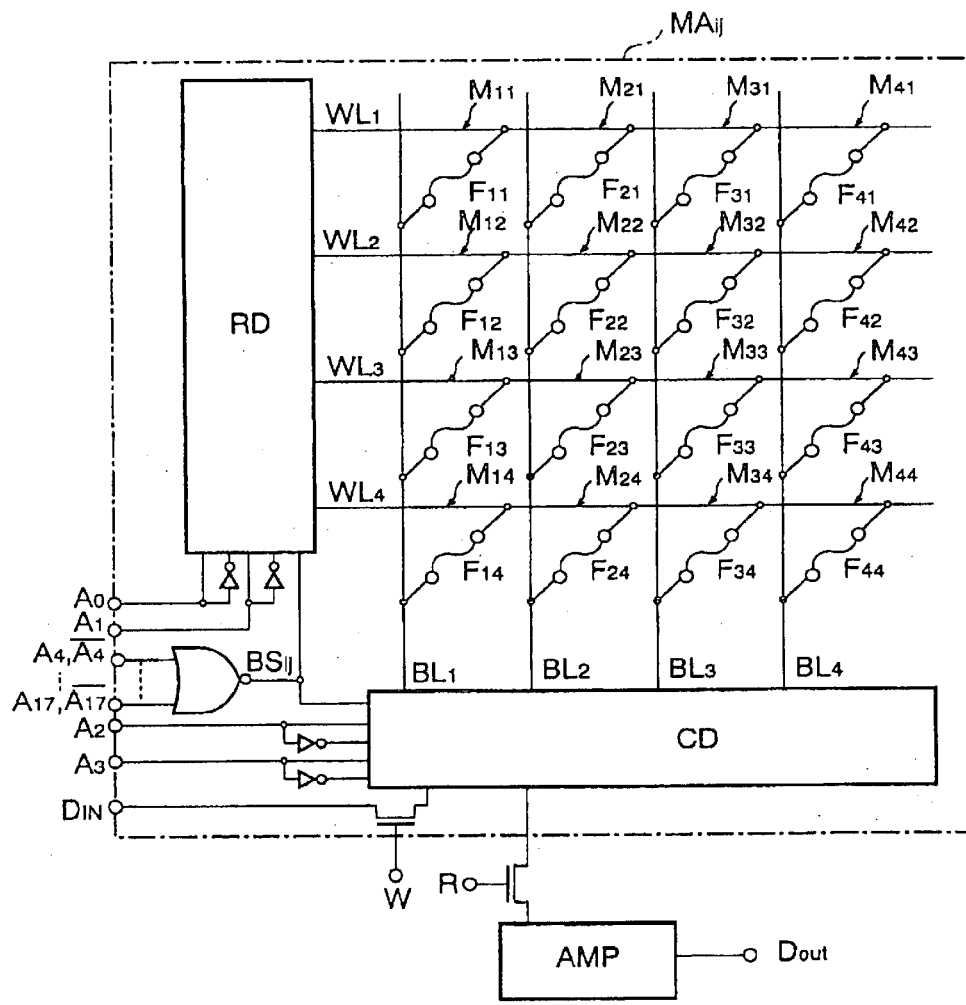
FIG. 17 is a circuit diagram of the configuration of a semiconductor nonvolatile memory device (memory chip) according to a fourth embodiment.

In the semiconductor nonvolatile memory device (memory chip) according to the present embodiment, as shown in the equivalent circuit diagram of FIG. 17, in an ij-th memory cell array $MA_{ij}$, memory cells M ($M_{11}$, $M_{12}$, ..., $M_{34}$, $M_{44}$) comprised of insulating film breakage type fuses F ($F_{11}$, $F_{12}$, ..., $F_{34}$, $F_{44}$) are arranged in a matrix form at positions where the word lines WL ($WL_1$, $WL_2$, $WL_3$, $WL_4$) connected to the row decoder RD and the bit lines BL ($BL_1$, $BL_2$, $BL_3$, $BL_4$) connected to the column decoder CD intersect.

Figure 18:
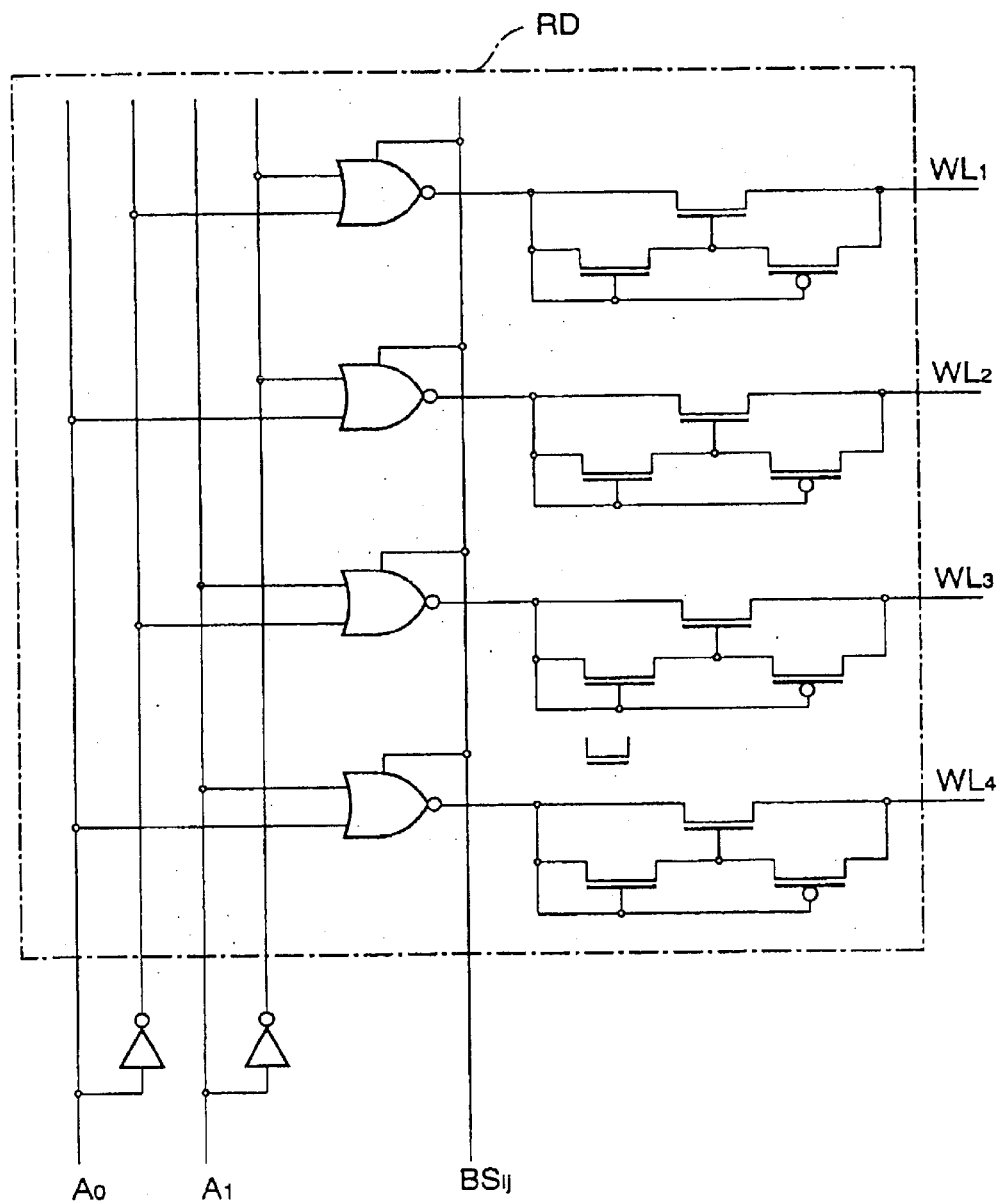
FIG. 18 is an equivalent circuit diagram of an example of the configuration of a row decoder of the memory chip according to the fourth embodiment.

FIG. 18 is an equivalent circuit diagram of an example of the configuration of the row decoder RD.

In the row decoder RD, for example the voltage $V_{dd}$ is applied to word lines WL ($WL_1$, $WL_2$, $WL_3$, $WL_4$) selected by OR logic circuits with address data $A_i$ ($A_0$, $\underline{A}_0$, $A_1$, $\underline{A}_1$...) and selection signal $BS_{ij}$, etc. input thereto or other circuits.

Figure 19:
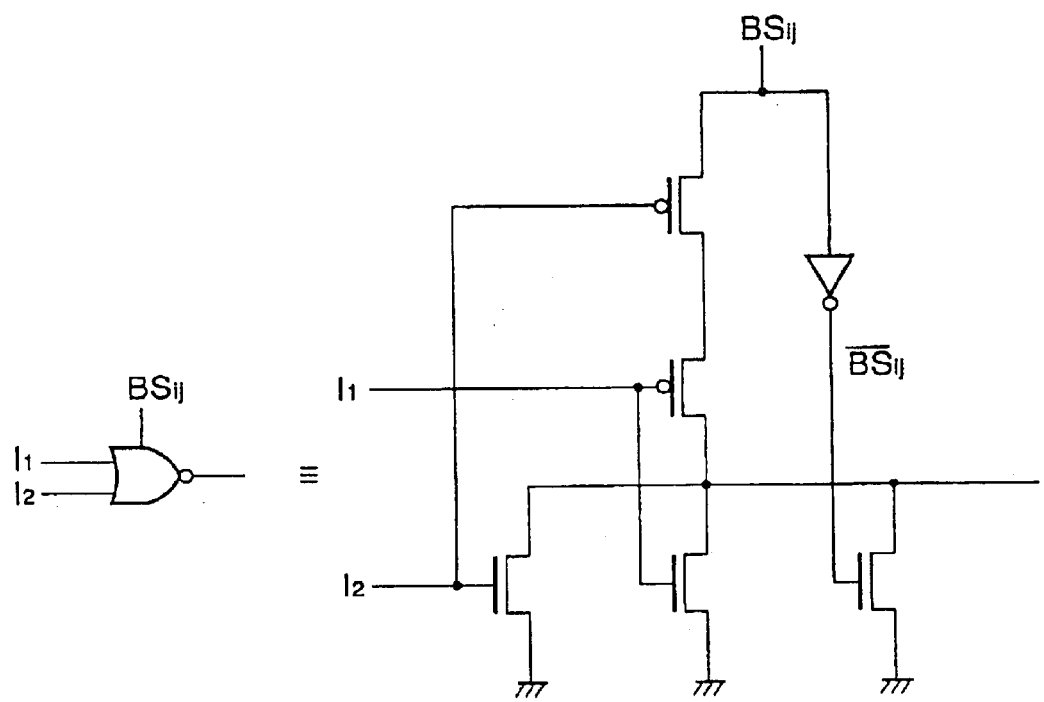
FIG. 19 is an equivalent circuit diagram of symbols used in the equivalent circuit diagram of the row decoder and column decoder of the memory chip according to the fourth embodiment.

FIG. 19 is an equivalent circuit diagram of the configuration of the OR logic circuit receiving three inputting systems of the address data $A_i$, selection signal $BS_{ij}$, etc. in the row decoder RD and outputting one system.

Figure 20:
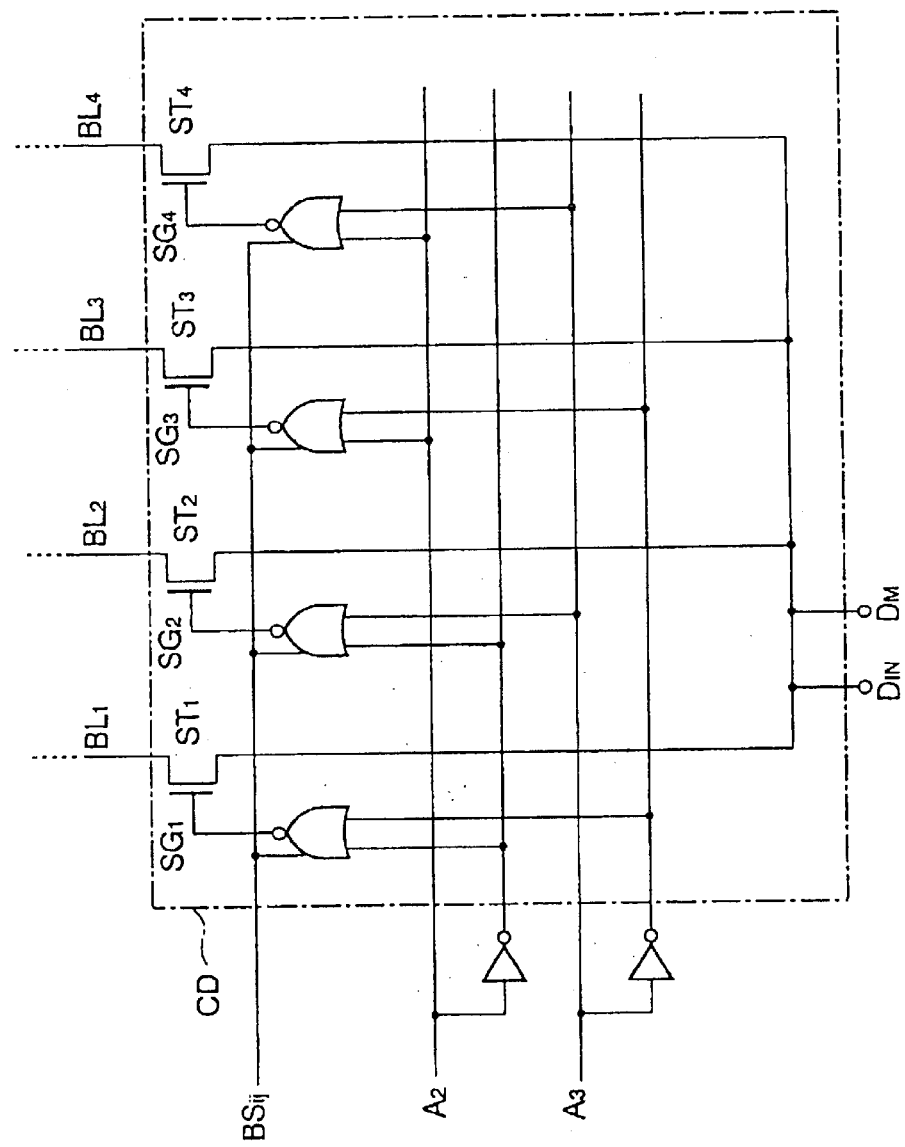
FIG. 20 is an equivalent circuit diagram of an example of the configuration of a column decoder of the memory chip according to the fourth embodiment.

FIG. 20 is an equivalent circuit diagram of an example of the configuration of the column decoder CD.

In the column decoder CD, in the same way as the row decoder RD, the bit line BL selected by the OR logic circuits with address data $A_i$ ($A_2$, $\underline{A}_2$, $A_3$, $\underline{A}_3$...) and selection signal $BS_{ij}$, etc. input thereto and the selection transistors ST ($ST_1$, $ST_2$, $ST_3$, $ST_4$) having selection gates SG ($SG_1$, $SG_2$, $SG_3$, $SG_4$) receives the input data $D_{IN}$ when the write signal W becomes ON. Alternatively, the memory cell data DM is read out from the bit line BL when the read signal R becomes ON.

The OR logic circuit receiving the three inputting systems of the address data Ai, the selection signal $BS_{ij}$, etc. at the column decoder CD and outputting one system is identical to the circuit shown in FIG. 19.

The amplifier AMP in FIG. 17 can be configured in the same way as that of the amplifier in the first embodiment, that is, can be configured of three current mirror amplifiers each comprised of two transistors. By this, current in accordance with the memory cell data $D_M$ can be amplified for example 1000-fold and extracted as the output data.

Figure 21A:
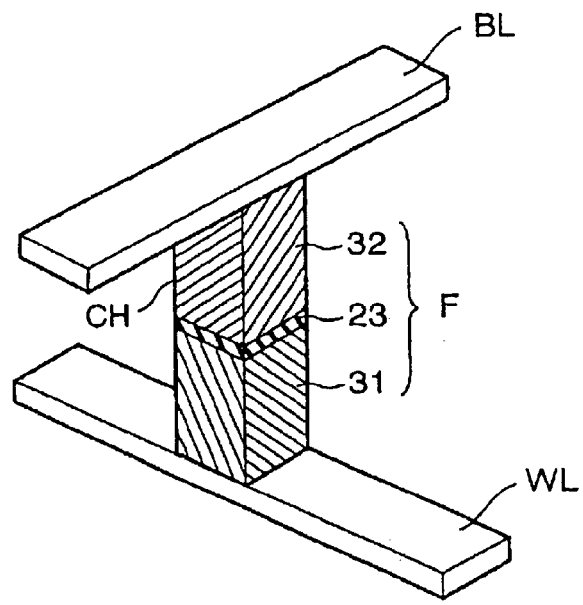
FIG. 21A is a schematic perspective view of a memory cell according to the fourth embodiment.
Figure 21B:
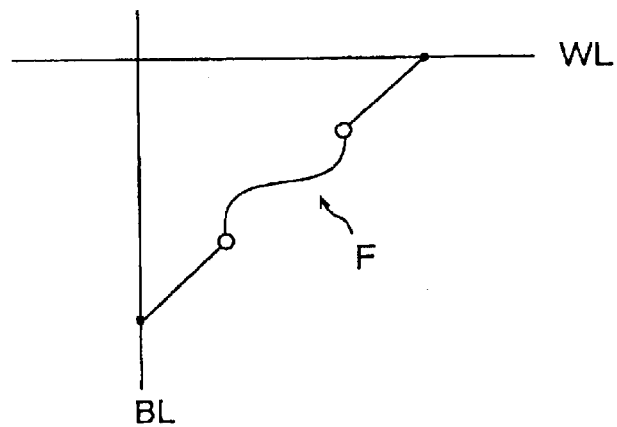
FIG. 21B is a corresponding equivalent circuit diagram.

FIG. 21A is a schematic perspective view of a memory cell according to the present embodiment, while FIG. 21B is a corresponding equivalent circuit diagram.

A not illustrated first insulating film is formed at an upper layer of the first interconnection acting as the word line WL, and a contact hole CH reaching the word line WL is formed.

In the contact hole CH, the silicon-based first semiconductor layer 31 containing the n-type impurity with a high concentration is formed while being connected to the word line WL, the second insulating film 23 of the silicon oxide is formed at an upper layer thereof, and a silicon-based second semiconductor layer 32 containing the p-type impurity with a high concentration is formed at an upper layer thereof.

Also, the second interconnection acting as the bit line BL extending in for example a direction orthogonal to the word line WL is formed while being connected to the second semiconductor layer 32.

In each memory cell having the above structure, the stack of the first semiconductor layer 31, second insulating film 23, and second semiconductor layer 32 becomes the insulating film breakage type fuse F, that is, a programmable portion. By applying a predetermined high voltage between the first semiconductor layer 31 and the second semiconductor layer 32 of the memory cell selected so as to correspond to the data to be stored, insulation breakage in the second insulating film 23 is caused, and the first semiconductor layer 31 and the second semiconductor layer 32 are made conductive. Therefore, data can be stored by the conduction or nonconduction between the first semiconductor layer 31 and the second semiconductor layer in each memory cell.

Usually, after causing the insulation breakage in the second insulating film 23 as described above, the conduction between the first semiconductor layer 31 and the second semiconductor layer 32 is confirmed to confirm if the writing succeeded.

In order to read out the data stored in the memory cell as described above, for example, the conduction or nonconduction between the word line and the bit line connected to the memory cell to be read out is checked to thereby obtain the read data.

Figure 22:
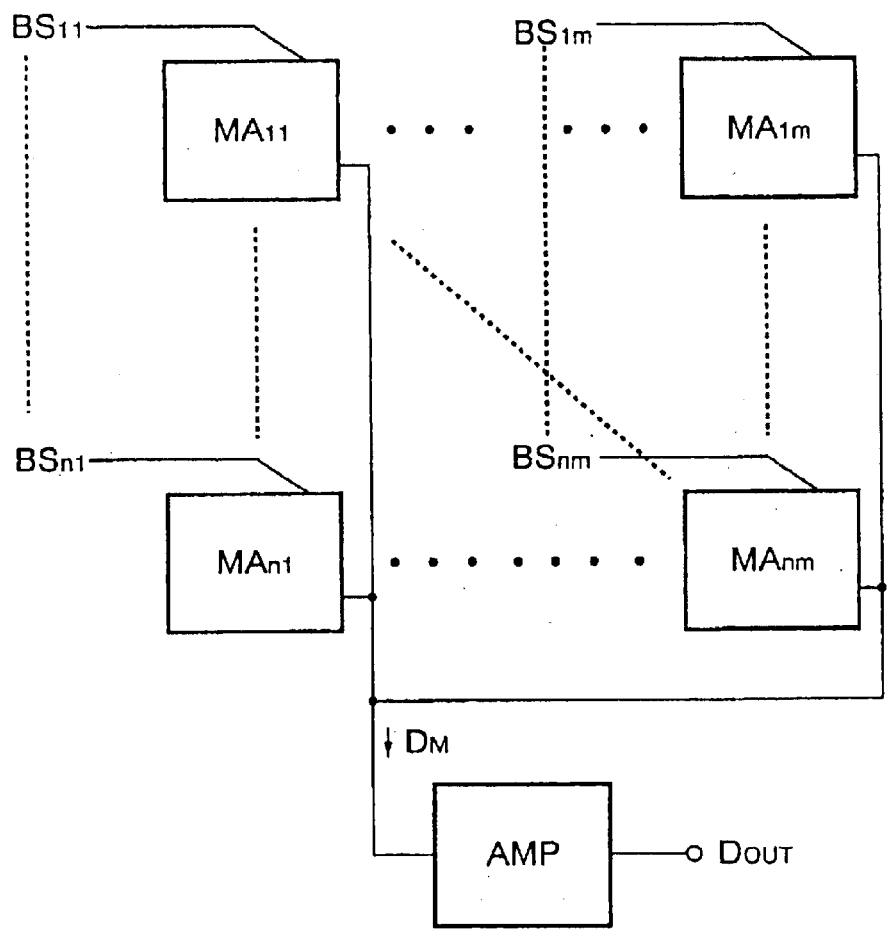
FIG. 22 is a circuit diagram of the configuration of a semiconductor nonvolatile memory device comprised of a plurality of unit memory cell arrays integrated therein according to the fourth embodiment.

FIG. 22 is a circuit diagram of the configuration of a semiconductor nonvolatile memory device wherein a plurality of unit memory cell arrays according to the present embodiment are integrated.

Namely, a plurality of ij-th memory cell arrays $MA_{ij}$ of the above configuration are integrated from (11) to (nm).

The memory cell data DM is output from each memory cell array $MA_{ij}$ selected by the selection signal $BS_{ij}$, amplified by the amplifier AMP, and extracted from the $D_{OUT}$ as the output data.

Figure 23A:
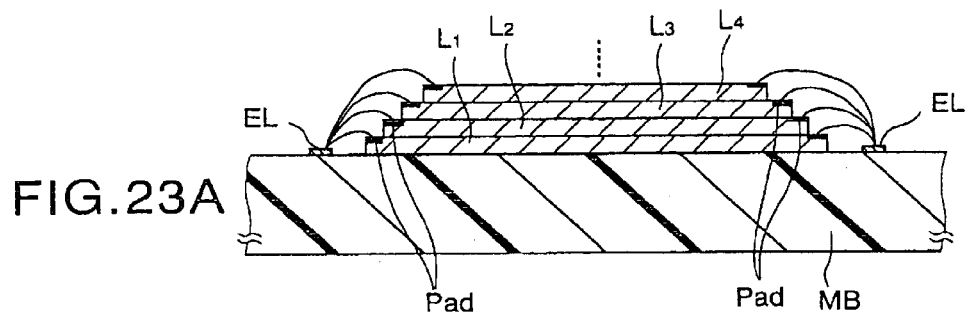
FIG. 23A is a sectional view of an electronic circuit device mounting the semiconductor nonvolatile memory device (memory chip) integrated in the three-dimensional direction in the fourth embodiment thereon.
Figure 23B:
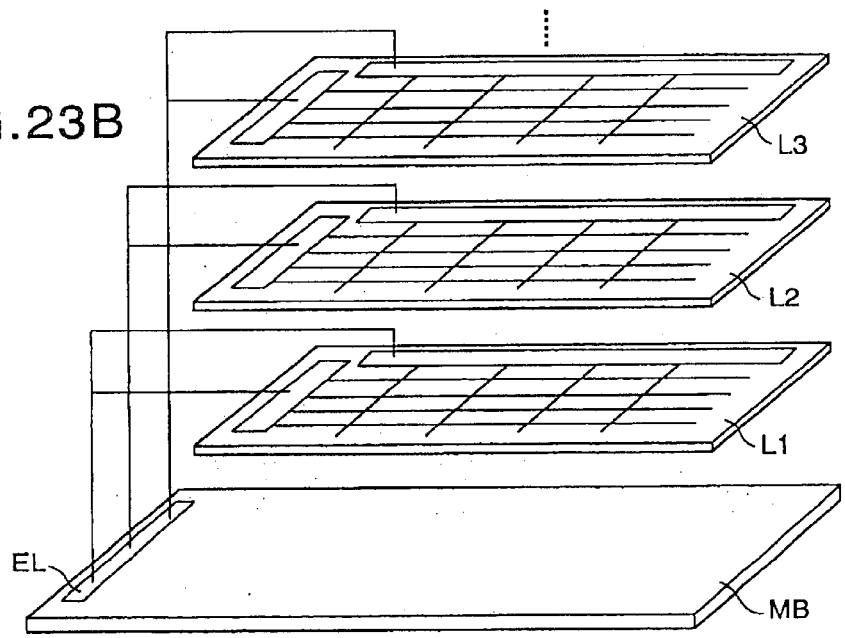
FIG. 23B is a schematic view of the stacked configuration thereof.

FIG. 23A is a sectional view of a configuration wherein the memory cell arrays according to the present embodiment are integrated in three dimensions to form a memory chip, while FIG. 23B is a schematic view of the stacked configuration thereof.

In the memory chip, the stack of the first interconnection, first insulating film, and second interconnection comprising the unit memory cell array is used as the unit layer, and a plurality of these unit layers (L1, L2, L3, L4, . . . ) are stacked.

Each of the unit layers (L1, L2, L3, L4, . . . ); is provided with a row decoder and column decoder etc. Memory cells comprised of the insulating film breakage type fuses F having the above structure are arranged at intersecting points of the first interconnections and the second interconnections of the unit layers.

The pads PD are opened in the end portions of the unit layers (L1, L2, L3, L4, . . . ), the memory chip comprising a stack of the unit layers is fixed onto a mount board MB by die bonding or the like, and an electrode EL such as land formed on the mount board MB and the pad Pad of each layer of the memory chip are connected by wire bonding or the like.

The semiconductor nonvolatile memory device (memory chip) according to the present embodiment has a simple configuration where, in each memory cell array comprising a memory chip, each memory cell has one insulating film breakage type fuse. The semiconductor nonvolatile memory device (memory chip) can be easily and cheaply produced by improving the reproducibility and reliability of the insulation breakage of the silicon oxide film.

In the unit memory cell arrays comprising the semiconductor nonvolatile memory device (memory chip) according to the present embodiment, substantially the memory chip according to the first embodiment can be similarly formed.

Namely, the first interconnection is formed on the predetermined substrate or the like, the first insulating film is grown at ane upper layer thereof, a contact hole reaching the first interconnection is formed, the first semiconductor layer, second insulating film, and second semiconductor layer are stacked in the contact hole, and the second interconnection is formed so as to be connected to the second semiconductor layer, whereby the memory cell array forming the unit layer can be formed.

Further, by repeating the procedures of forming the insulating film between unit layers and forming the first interconnection to the second interconnection, a memory chip comprised of unit memory cell arrays stacked therein can be formed.

The memory chip formed as described above is used by opening the pad for every unit and mounting it on the mount board.

Fifth Embodiment

Figure 24:
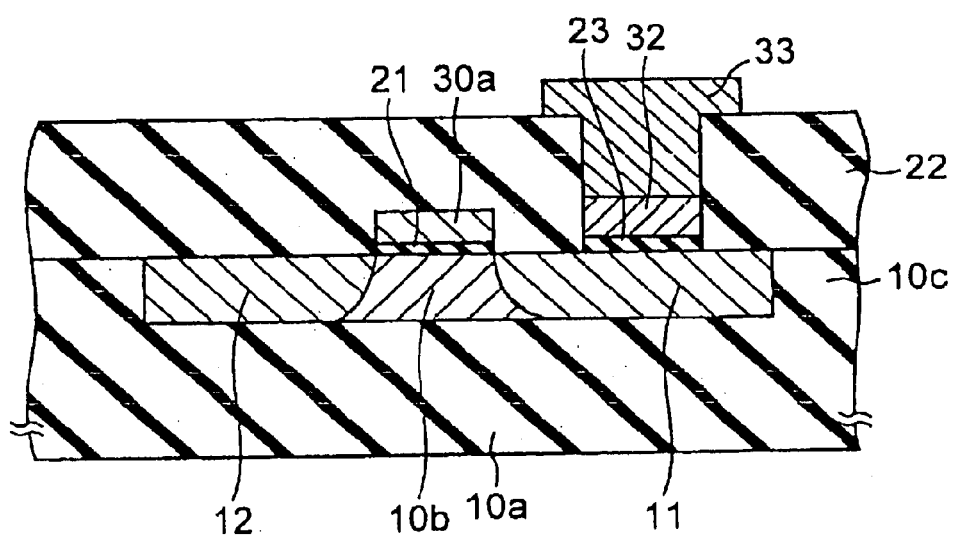
FIG. 24 is a sectional view of the memory cell of a semiconductor nonvolatile memory device according to a fifth embodiment.

The semiconductor nonvolatile memory device (memory chip) according to the present embodiment makes the access transistor a TFT (thin film transistor) as shown in the sectional view of FIG. 24.

Namely, a gate insulating film 21 of silicon oxide is formed on a channel forming region in an active region isolated by an element isolation region 10c of a semiconductor layer (also referred to as the SOI layer) 10b having an SOI (semiconductor on insulator) structure formed on an insulating substrate 10a obtained by covering a glass substrate or the surface layer by an insulator such as silicon oxide. A gate electrode 30a made of polysilicon and acting as the word line WL is formed at an upper layer thereof.

A source region 11 and a drain region 12 containing the n-type impurities with a high concentration are formed in the SOI layer 10b on the two sides of the gate electrode 30a.

An n-channel MOS transistor having an TFT structure acting as the access transistor of the memory cell is comprised as described above.

The SOI layer 10b is formed with a thickness of for example about 1 µm, and the insulating substrate 10a is formed with a thickness of about several to several hundred µm.

In this case, the channel length of the transistor is determined to about 0.1 µm in the same way as the first embodiment, and a complete depletion type transistor can be obtained wherein the source and drain regions have depths reaching the bottom surface of the SOI layer 10b.

A first insulating film 22 of for example silicon oxide is formed over the entire surface while covering the n-channel MOS transistor, a contact hole CH reaching the source region 11 is formed, a second insulating film 23 and an semiconductor layer 32 containing the p-type impurity with a high concentration are stacked in the contact hole CH, and an upper layer interconnection 33 made of aluminum or another metal interconnection and acting as the bit line BL is formed while connected to the semiconductor layer 32.

In the first embodiment, the junction depth of the source region is shallow, so the first semiconductor layer 31 was required for preventing the influence of the insulation breakage from reaching the lower portion of the source region, but junction leakage is not caused in an TFT having the above structure. Therefore, a configuration of directly stacking the second insulating film 23 and the semiconductor layer 32 containing the p-type impurity with a high concentration on the source region can be employed.

In the stacked structure of the source region 11, second insulating film 23, and semiconductor layer 32, the energy E by the recombination RC of electrons and holes is efficiently transferred to the oxide film, therefore the reproducibility and reliability are improved and thus insulation breakage in the second insulating film is caused.

The semiconductor nonvolatile memory device (memory chip) according to the present embodiment has a simple configuration where each of memory cells comprising the memory cell array has one n-channel MOS transistor (NMOS) and one insulating film breakage type fuse F, that is, a programmable portion. The semiconductor nonvolatile memory device (memory chip) can be easily and cheaply produced by improving the reproducibility and reliability of insulation breakage of the silicon oxide film.

Also, by using the semiconductor nonvolatile memory device (memory chip) of the present embodiment in combination with the control chip as shown in FIG. 5, the PMOS's (p-channel MOS transistor) required for the circuit configuration of the decoder, amplifier, etc. can be provided not on the memory chip, but on the control chip. Namely, by employing the configuration wherein the row decoder and the column decoder are comprised of only pass transistors (NMOS), etc., it becomes possible to form the memory chip per se by the NMOS process, and it is possible to produce the same while reducing the number of masks to for example about six. Therefore, the manufacturing cost of the memory chip can be greatly reduced.

On the other hand, the control chip per se is originally produced by the CMOS process, so the cost will not largely increase.

Accordingly, due to the great reduction of the cost of the memory chip, the manufacturing cost of the storage medium (memory card) with the built-in memory chip can be lowered.

In the semiconductor nonvolatile memory device having an n-channel MOS transistor having a TFT structure according to the present embodiment, by defining the SOI structure layers (L1, L2, L3, L4, . . . ) comprised of insulating layers and semiconductor layers formed at the upper layers thereof as unit layers, and stacking a plurality of unit layers in the same way as the stack shown in FIGS. 23A and 23B according to the fourth embodiment, integration in three-dimensional directions can be achieved. The insulating layer in this case is made of for example a silicon oxide layer formed by CVD and has a thickness thereof determined to about 10 $\mu$m.

In each SOI structure layer described above, a memory cell array wherein the memory cells each being comprised of the TFT of above structure and the insulation breakage type fuse are arranged in the SOI layer in a matrix form, and a row decoder and column decoder tc. made of for example pass transistors are formed.

The pads PAD are opened in the end portions of the layers of the SOI structure layers. (L1, L2, L3, L4, . . . ).

The memory chip of the stack of the SOI structure layers (L1, L2, L3, L4, . . . ) is fixed to the mount board MB by die bonding or the like, and the electrodes EL such as lands formed on the mount board MB and the pad PAD of each layer of memory chip are connected by wire bonding or the like.

In a memory chip integrated in the three-dimensional directions, by stacking for example N number of SOI structure layers, the manufacturing cost per unit storage capacity can be reduced to about 1/N, so the effect of reduction of cost can be further increased.

In the memory chip of the SOI structure, a memory cell comprised of only the insulation breakage type fuse as in the fourth embodiment can be formed.

Further, in order to reduce the manufacturing cost per unit storage capacity, the SOI structure layer having the memory cells comprised of insulation breakage type fuses can be stacked as described above too.

The present invention is not limited to the above embodiments.

For example, the row decoder, column decoder, amplifier, etc. are not limited to the configuration comprised of only NMOS transistors, but can be formed by the CMOS process including inverters or the like too.

As the source and drain region of the access transistor, various structures such as LDD structures can be employed.

Other than this, various modifications are possible within a range not out of the gist of the present invention.

According to the semiconductor nonvolatile memory device of the present invention, the reproducibility and reliability are improved, thus insulation breakage in the second insulating film can be caused. Also, since the memory cell can be comprised by a simple structure, by making for example the row decoder and column decoder by only pass transistors, it is possible to produce the device while reducing the number of masks, and it is possible to suppress the manufacturing cost.

Also, according to the method for production of a semiconductor nonvolatile memory device of the present invention, it is possible to produce a semiconductor nonvolatile memory device having a memory cell capable of improving the reproducibility and reliability and causing insulation breakage in the second insulating film while reducing the number of masks, and the manufacturing cost can be suppressed.

While the invention has been described with reference to specific embodiment chosen for purpose of illustration, it should be apparent that numerous modifications could be made thereto by those skilled in the art without departing from the basic concept and scope of the invention.

What is claimed is:

1. A method for production of a semiconductor nonvolatile memory device having at least one memory cell, wherein a process of forming the memory cell includes steps of:
   forming an impurity region of a first conductivity type in a semiconductor substrate;
   forming a first insulating film on the semiconductor substrate while covering the impurity region;

forming an opening in the first insulating film so as to reach the impurity region;

forming a program portion comprising a first semiconductor layer of a first conductivity type, a second insulating film, and a second semiconductor layer of a second conductivity type, the first semiconductor layer, the second insulating film and the second semiconductor layer being successively stacked in the opening, the first semiconductor layer being formed on the impurity region, the second insulating film being changed in a conductive state in response to a program data to thereby electrically connect between the first and second semiconductor layers, wherein said second insulating film is formed on the first semiconductor layer and said second semiconductor layer is on said second insulating film; and wherein said second insulating film is formed in contact with said first semiconductor layer, and said semiconductor layer is formed in contact with said second insulating film.

2. A method for production of a semiconductor nonvolatile memory device as set forth in claim 1, wherein the step of forming the first semiconductor layer is a step of forming the same by selective epitaxial growth.

3. A method for production of a semiconductor nonvolatile memory device as set forth in claim 1, wherein a step of forming a gate electrode acting as a word line on the semiconductor substrate acting as a channel forming region via a gate insulating film is provided before the step of forming the impurity region of the first conductivity type on the semiconductor substrate, and in the step of forming the impurity region of the first conductivity type on the semiconductor substrate, in the semiconductor substrate on both side portions of the gate electrode a source region and a drain region acting as the impurity region are formed, and provision is further made of a step of forming a bit line at an upper layer of the second semiconductor layer.

4. A method for production of a semiconductor nonvolatile memory device as set forth in claim 3, wherein the row decoder and the column decoder connected to the word line and the bit line are formed by only pass transistors.

5. A method for production of a semiconductor nonvolatile memory device having at least one memory cell, wherein a process of forming the memory cell includes steps of:
forming a first interconnection;
forming a first insulating film at an upper layer of the first interconnection;
forming an opening in the first insulating film so as to reach the first interconnection;
forming a program portion comprising a first semiconductor layer of a first conductivity type, a second insulating film, and a second semiconductor layer of a second conductivity type, the first semiconductor layer, the second insulating film and the second semiconductor layer being successively stacked in the opening, the first semiconductor layer being formed on the first interconnection, the second insulating film being changed in a conductive state in response to a program data to thereby electrically connect between the first and second semiconductor layers, and; and forming a second interconnection so as to be connected to the second semiconductor layer, and wherein said second insulating film is on said first semiconductor layer, and said second semiconductor layer is on said second insulating film, and wherein said second insulating film is in contact with said first semiconductor layer, and said second semiconductor layer is in contact with said second insulating film.

6. A method for production of a semiconductor nonvolatile memory device as set forth in claim 5, wherein the first interconnection is formed as a word line, and the second interconnection is formed as a bit line.

7. A method for production of a semiconductor nonvolatile memory device as set forth in claim 6, wherein the row decoder and the column decoder connected to the word line and the bit line are formed by only pass transistors.

8. A method for production of a semiconductor nonvolatile memory device having at least one memory cell, wherein a process of forming the memory cell includes steps of:
forming an impurity region of a first conductivity type in a first semiconductor layer on an insulating substrate;
forming a first insulating film on the first semiconductor layer while covering the impurity region;
forming an opening in the first insulating film so as to reach the impurity region;
forming a program portion comprising a second insulating film and a second semiconductor layer of a second conductivity type, the second insulating film and the second semiconductor layer being successively stacked in the opening, said second insulating film being formed on the impurity region, the second insulating film being changed in a conductive state in response to a program data to thereby electrically connect between the impurity region and the second semiconductor layer;

wherein said second semiconductor layer is formed on the second insulating film, and wherein said second semiconductor layer is in contact with said second insulating film.

9. A method for production of a semiconductor nonvolatile memory device as set forth in claim 8, wherein a step of forming a gate electrode acting as a word line on the first semiconductor layer acting as a channel forming region via a gate insulating film is provided before the step of forming the impurity region of the first conductivity type in the first semiconductor layer, and in the step of forming the impurity region of the first conductivity type in the first semiconductor layer, in the first semiconductor layer on both side portions of the gate electrode a source region and a drain region acting as the impurity region and formed, and provision is further made of a step of forming a bit line at an upper layer of the second semiconductor layer.

10. A method for production of a semiconductor nonvolatile memory device as set forth in claim 9, wherein the row decoder and the column decoder connected to the word line and the bit line are formed by only pass transistors.

* * * * *